US012586630B2

(12) United States Patent　　　(10) Patent No.:　US 12,586,630 B2

Lu et al.　　　　　　　　　　　　(45) Date of Patent:　Mar. 24, 2026

(54) MEMORY ARRAY CIRCUIT

(71) Applicant: Invention And Collaboration Laboratory Pte. Ltd., Singapore (SG)

(72) Inventors: Chao-Chun Lu, Taipei City (TW); Chun Shiah, Hsinchu City (TW); Shih-Hsing Wang, Hsinchu (TW)

(73) Assignee: Invention And Collaboration Laboratory Pte. Ltd., Singapore (SG)

( * ) Notice: Subject to any disclaimer, the term of this patent is extended or adjusted under 35 U.S.C. 154(b) by 184 days.

(21) Appl. No.: 18/242,017

(22) Filed: Sep. 5, 2023

(65) Prior Publication Data

US 2024/0079048 A1　　Mar. 7, 2024

Related U.S. Application Data

(60) Provisional application No. 63/403,802, filed on Sep. 5, 2022.

(51) Int. Cl.
　　*G11C 11/4091*　　(2006.01)
　　*G11C 5/06*　　　(2006.01)
　　*G11C 11/404*　　(2006.01)
　　*G11C 11/4097*　　(2006.01)

(52) U.S. Cl.
　　CPC .......... *G11C 11/4091* (2013.01); *G11C 5/063* (2013.01); *G11C 11/4045* (2013.01); *G11C 11/4097* (2013.01)

(58) Field of Classification Search
　　CPC . G11C 11/4091; G11C 5/063; G11C 11/4045; G11C 11/4097; H10B 12/482; H10B 12/485; H10B 12/488; H10B 12/50; H10D 89/10
　　USPC .................................................. 365/189.011
　　See application file for complete search history.

(56) References Cited

U.S. PATENT DOCUMENTS

2021/0399048 A1*　12/2021　Wu ...................... H10N 70/066

FOREIGN PATENT DOCUMENTS

| JP | 5-129554 A | 5/1993 |
| KR | 10-2022-0116108 A | 8/2022 |
| TW | 202219948 A | 5/2022 |

* cited by examiner

*Primary Examiner* — Huan Hoang

(74) *Attorney, Agent, or Firm* — Winston Hsu

(57)　　　　　ABSTRACT

A memory array circuit includes a semiconductor substrate, a bit line, a complementary bit line, and a bit line sense amplifier circuit. The semiconductor substrate has an original surface. The bit line sense amplifier circuit is connected to the bit line and the complementary bit line, and the bit line sense amplifier circuit includes a first plurality of transistors and a first set of connection lines. Each transistor includes a gate node, a first conductive node, and a second conductive node. The first set of connection lines connects the first plurality of transistors to the bit line and the complementary bit line; wherein the first set of connection lines is above the original surface of the semiconductor substrate, and the bit line and the complementary bit line are under the original surface of the semiconductor substrate.

15 Claims, 31 Drawing Sheets

112

Utilize a photolithographic technique to form multiple interconnection lines    114

The metal layer is etched back to form underground bit lines (UGBL) or underground interconnection lines    116

An oxide-2 layer is deposited in the trench and planarized by the CMP technique    118

120

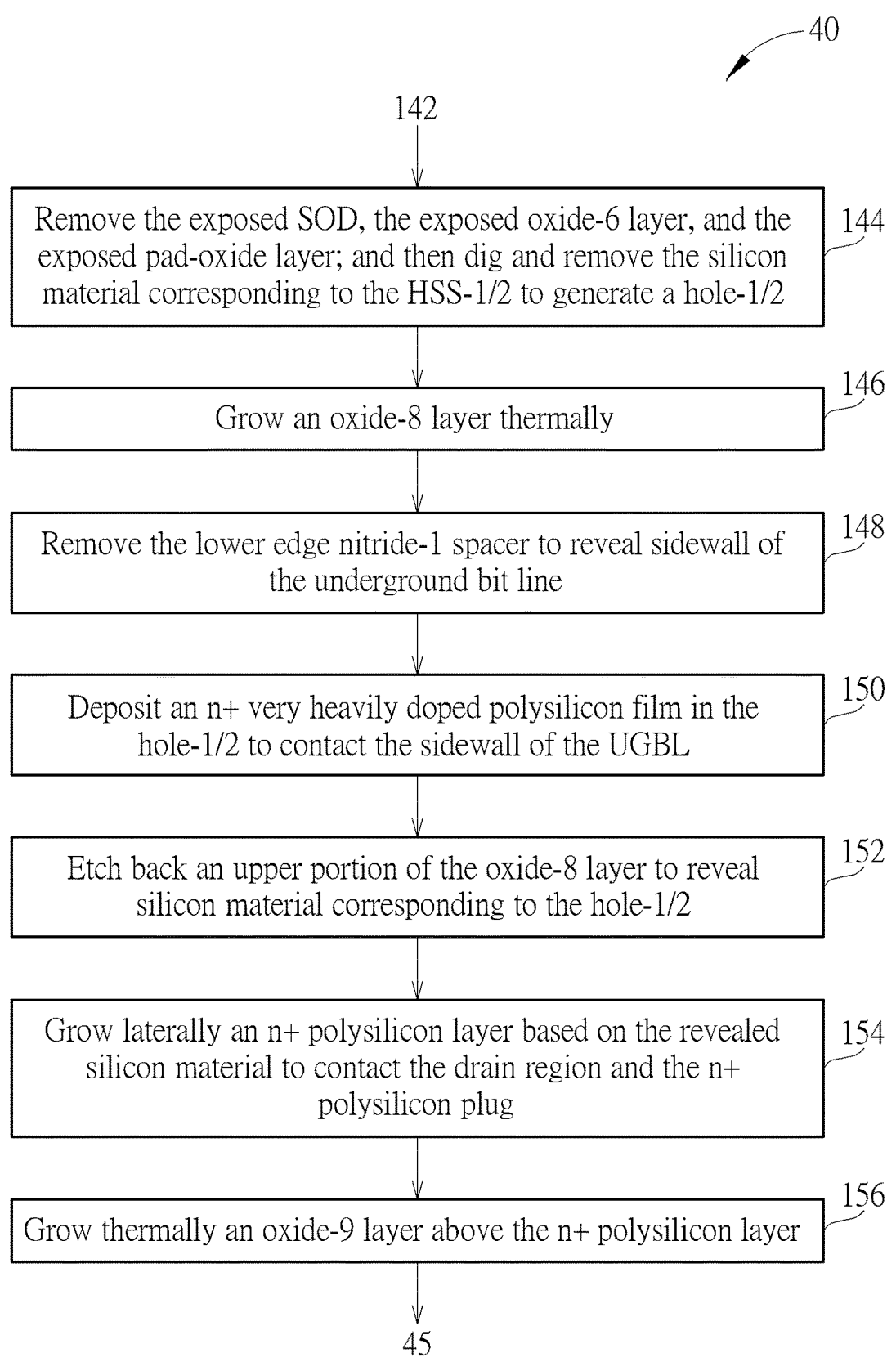

40

142

Remove the exposed SOD, the exposed oxide-6 layer, and the exposed pad-oxide layer; and then dig and remove the silicon material corresponding to the HSS-1/2 to generate a hole-1/2    144

Grow an oxide-8 layer thermally    146

Remove the lower edge nitride-1 spacer to reveal sidewall of the underground bit line    148

Deposit an n+ very heavily doped polysilicon film in the hole-1/2 to contact the sidewall of the UGBL    150

Etch back an upper portion of the oxide-8 layer to reveal silicon material corresponding to the hole-1/2    152

Grow laterally an n+ polysilicon layer based on the revealed silicon material to contact the drain region and the n+ polysilicon plug    154

Grow thermally an oxide-9 layer above the n+ polysilicon layer    156

Cross section along the X direction

Cross-point square

1106

1104

1102

CVD-STI-Oxide2

206

204

Longitudinal stripes for defining transistors and word lines

CVD-STI-Oxide2

STI          STI

202

(a)

Longitudinal stripes for defining transistors and word lines

CVD-STI-Oxide2

1106    206

Cutline along the X direction

Cross-point square    Cross-point square

Cutline Y2

Lower edge nitride-1 spacer

Oxide-1 spacer (b)

Cutline along
the Y2 direction

UGBL(a sketch to illustrate a UGBL behind the scene of this cross-section view along the X-direction cutline)

MEMORY ARRAY CIRCUIT

CROSS REFERENCE TO RELATED APPLICATIONS

This application claims the benefit of U.S. Provisional Application No. 63/403,802, filed on Sep. 5, 2022. The content of the application is incorporated herein by reference.

BACKGROUND OF THE INVENTION

1. Field of the Invention

The present invention relates to a memory array circuit, and particularly to a memory array circuit that provides an underground interconnection or underground interconnection line embedded into a silicon substrate to have compact structure, smaller area, higher performance, lower complexity, and so on.

2. Description of the Prior Art

In the state-of-the-art integrated circuits, there are many transistors which are connected by conductive interconnections (e.g. metal wires, polysilicon wires, etc.) to facilitate the signal transfer among the gate, the source and the drain regions (GSD) of these transistors. All these metal wires depend on many contact holes and connection plugs to connect them with GSD, respectively, which causes significant challenges and difficulties with respect to chip-design targets of reducing area, power and noise and increasing performances of integrated circuits especially when the dimensions of integrate circuits on dice must be shrunk significantly owing to demands on scaling device dimensions in order to satisfy the Moore's Law. To give an example about concerning on the area penalty: a much larger source or drain diffusion area in contrast to the contact-hole size for connecting metal wires to either source or drain must be designed so that the unavoidable photolithographic misalignment due to limitations of lithographic tools should not cause the contact holes to be made outside the underneath edges of source or drain region, respectively. This inevitably increases diffusion areas of transistors and thus die areas, which induces large capacitances to cause significant penalties to the ac performance of circuits, to consume higher power and to add larger noises.

Moreover, in conventional DRAM structure, there are plurality of sense amplifiers connected to DRAM cell arrays through metal wires. Those metal wires disposed above the silicon substrate and the design rules for the pitch between metal wires will limit the shrinkablility of the DRAM dimension. Therefore, how to introduce a better self-aligned contact structure and technology to use the least surface areas for connecting the transistor to its first interconnect (metal) layer to transmit and receive signals is a key challenge for further effective scaling down and improving performance of integrated circuits.

SUMMARY OF THE INVENTION

The present invention discloses a circuit structural which achieves an underground interconnection or underground interconnection line embedded into the silicon substrate with both high conductivity and effectively optimized isolations from the silicon substrate. This underground interconnection can be connected vertically (bridged) to either source or drain region of any transistor by a compact self-alignment invention. Many device and circuit design innovations can thus be created. For example, create some underground interconnection meshes which can be vertically connected to various source and drain regions, respectively, and on the other ends be linked to various signal sources, ground and VDD.

Further chip architecture can even introduce different layers or various levels of supply voltages vertically distributed in the substrate of the die but embedded with necessary isolations underneath the horizontal silicon surface (HSS); this can enhance both transistor and circuit performances (speed, power and noise, etc.) accordingly and reduce more complexities above the HSS (e.g. the current complicated chip design may need to use the tenth layer of the interconnections as the VDD but the below nine layers of interconnections above HSS are needed to transfer signals in the state-of-the-art circuit designs; these ten interconnection lines are quite complicated to be stacked and consume quite large contact areas, etc.). To give an analogy for this invention: to build up different ladders from the wires under the HSS to the wires above the HSS, these wires under the HSS can be designed to have different depths which allow the wires to be distributed across the die for supplying various signals, ground or VDD levels without colliding one another in pretty wide or even wild dimensions into the silicon substrate just like many submarines sailing under the surface of a big ocean.

An embodiment of the present invention provides a memory array circuit. The memory array circuit includes a semiconductor substrate, a bit line and a complementary bit line, and a bit line sense amplifier circuit. The semiconductor substrate has an original surface. The bit line sense amplifier circuit electrically connected to the bit line and the complementary bit line includes a first plurality of transistors and a first set of connection lines. Each transistor includes a gate node, a first conductive node, and a second conductive node. The first set of connection lines electrically connects the first plurality of transistors to the bit line and the complementary bit line. The first set of connection lines is above the original surface of the semiconductor substrate, and the bit line and the complementary bit line are under the original surface of the semiconductor substrate.

According to one aspect of the present invention, the bit line and the complementary bit line are isolated from the semiconductor substrate.

According to one aspect of the present invention, the first set of connection lines connecting the first plurality of transistors to the bit line and the complementary bit line are made of a set of metal layers.

According to one aspect of the present invention, the first set of connection lines connects the first plurality of transistors to the bit line and the complementary bit line through a set of metal contacts connecting to the set of metal layers, a set of active regions connecting to the set of metal contacts, and a set of plugs connecting the set of active regions to the bit line and the complementary bit line.

According to one aspect of the present invention, one plug is within one active region, and the one plug is connected to a sidewall of the bit line.

According to one aspect of the present invention, the bit line is surrounded by one active region, and at least two plugs are within the one active region and connected to a first and a second sidewalls of the bit line, respectively.

According to one aspect of the present invention, the one active region is a dummy active region without any transistor therein.

According to one aspect of the present invention, the first set of connection lines connects gate nodes of the first plurality of transistors to the bit line and the complementary bit line.

According to one aspect of the present invention, the first set of connection lines connects first conductive nodes of the first plurality of transistors to the bit line and the complementary bit line.

According to one aspect of the present invention, the bit line and the complementary bit line are within one isolation region and located at two different levels respectively therein.

Another embodiment of the present invention provides a memory array circuit. The memory array circuit includes a semiconductor substrate, an access transistor, a capacitor, and a bit line sense amplifier circuit. The semiconductor substrate has an original surface. The access transistor is formed within a first active region of the semiconductor substrate. The capacitor is connected to a source region of the access transistor. The bit line is electrically connected to a drain region of the access transistor through a first plug under the original surface. The bit line sense amplifier circuit connected to the bit line includes a first plurality of transistors and a first set of connection lines. Each transistor includes a gate node, a first conductive node, and a second conductive node. The first set of connection lines electrically connects the first plurality of transistors to the bit line. The first set of connection lines is above the original surface of the semiconductor substrate, and the bit line is under the original surface of the semiconductor substrate.

According to one aspect of the present invention, the bit line is within an isolation region next to the first active region.

According to one aspect of the present invention, the first plug is within the first active region, and the first plug is connected to a sidewall of a first portion of the bit line.

According to one aspect of the present invention, the first set of connection lines are electrically connected to the bit line through a switch layer, the switch layer includes a second active region, a second plug in the second active region and connecting to a sidewall of a second portion of the bit line, and an electrical contact connecting the second active region to the first set of connection lines.

According to one aspect of the present invention, the second portion of the bit line is surrounded by the second active region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1B, FIG. 1C, FIG. 1D, FIG. 1E, FIG. 1F, FIG. 1G are diagrams illustrating FIG. 1A.

DETAILED DESCRIPTION

In order to illustrate the present invention for integrated circuits including logic or digital, analog, memory, etc. which covers so broadly, a focus on power connection circuit is firstly selected in the following description of the present invention; the core principle of the present invention is easier to be grasped.

Figure 1A:
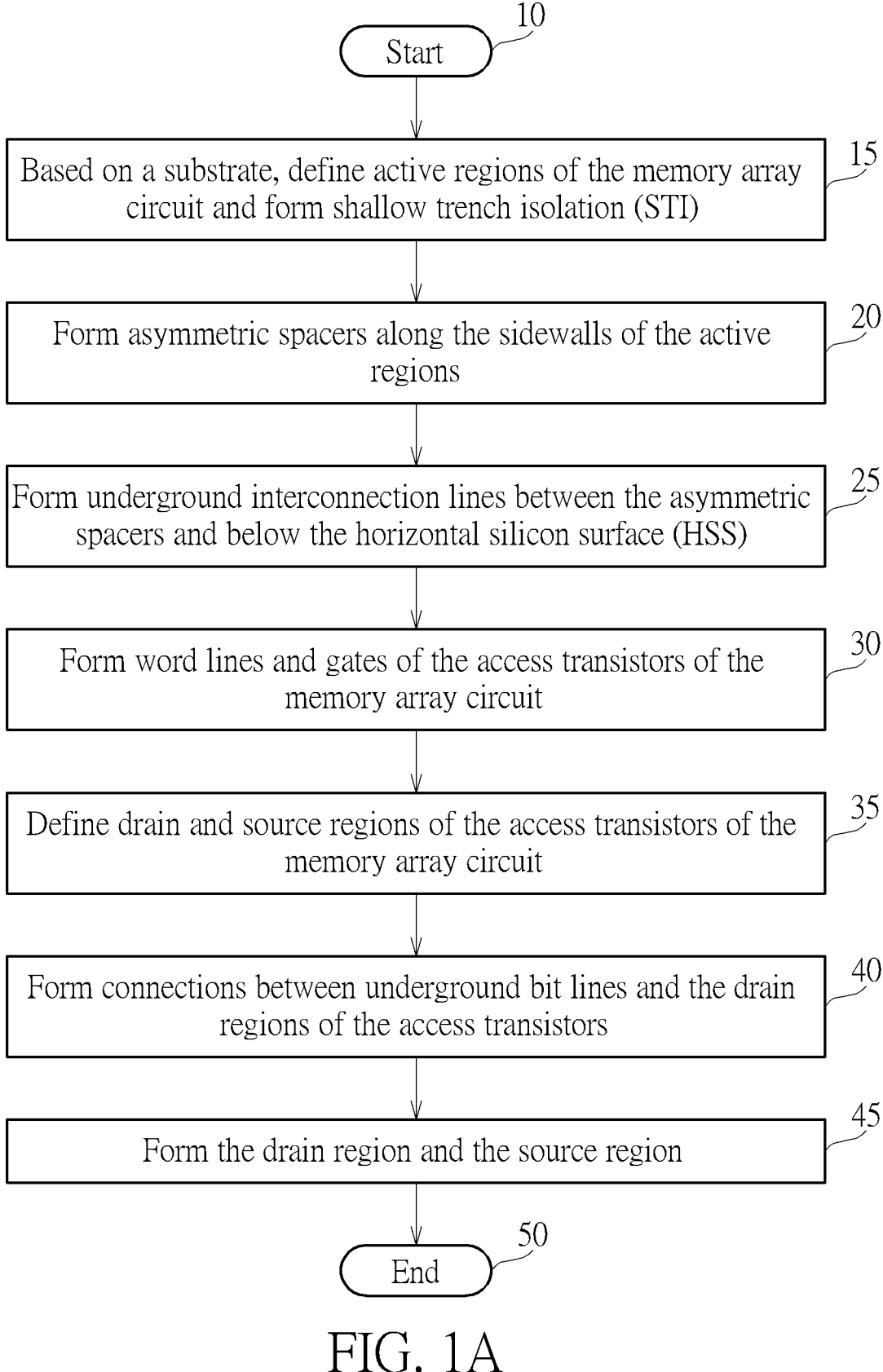
FIG. 1A is a flowchart illustrating a manufacturing method of a memory array circuit according to an embodiment of the present invention

Please refer to FIG. 1A, FIG. 1B, FIG. 1C, FIG. 1D, FIG. 1E, FIG. 1F, FIG. 1G, wherein FIG. 1A is a flowchart illustrating a manufacturing method of a memory array circuit according to an embodiment of the present invention.

Step 10: Start.

Step 15: Based on a substrate (such as, a p-type silicon substrate), define active regions of the memory array circuit and form shallow trench isolation (STI).

Step 20: Form asymmetric spacers along the sidewalls of the active regions.

Step 25: Form underground interconnection lines (such as bit lines) between the asymmetric spacers and below the horizontal silicon surface (HSS).

Step 30: Form word lines and gates of the access transistors of the memory array circuit.

Step 35: Define drain and source regions of the access transistors of the memory array circuit.

Step 40: Form connections between underground bit lines and the drain regions of the access transistors.

Step 45: Form the drain region and the source region.

Step 50: End.

Figure 1B:
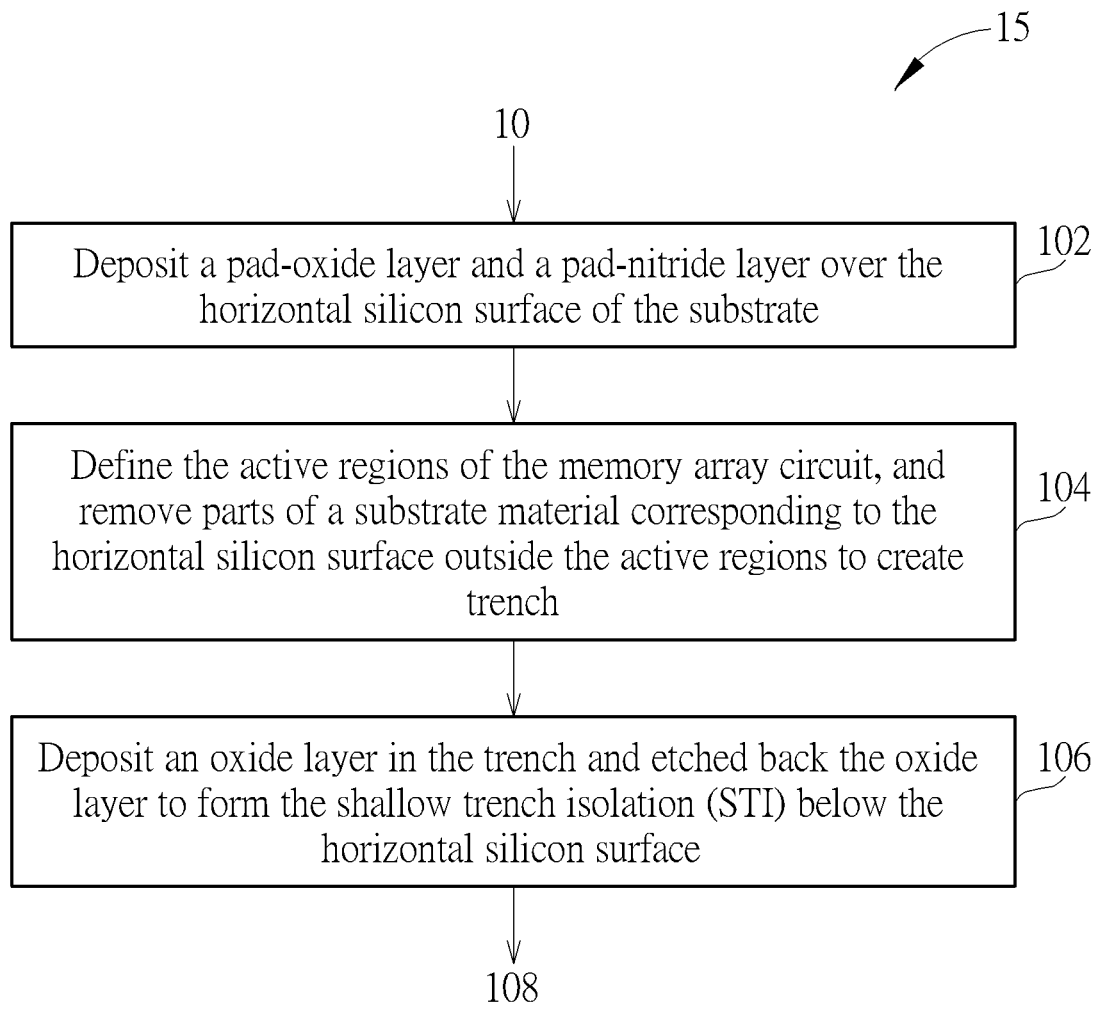
Figure 2:
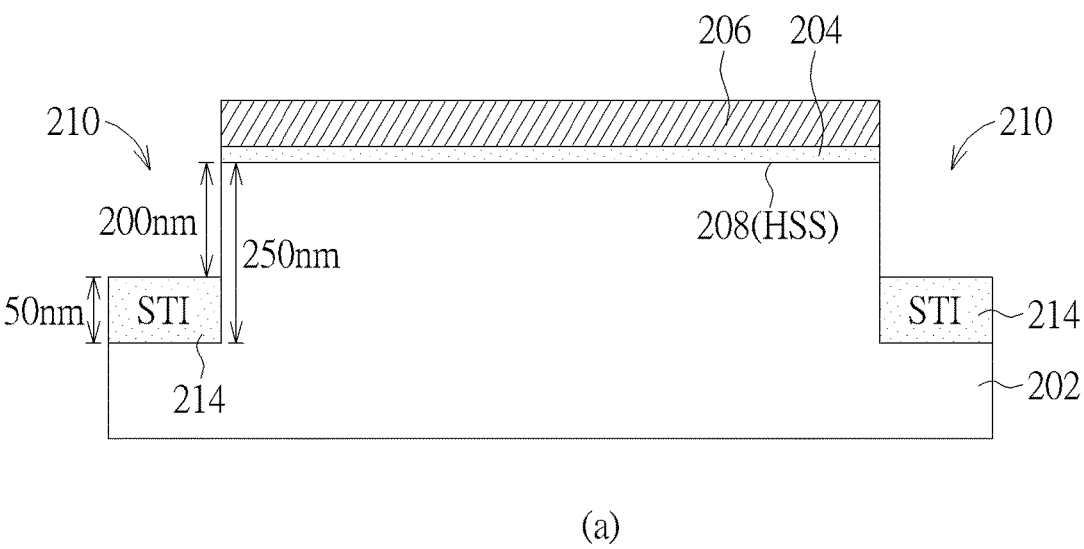
FIG. 2 is a diagram illustrating a top view and a cross-section view along an X direction after the pad-nitride layer and the pad-Oxide layer are deposited and the STI is formed.
Figure 2:
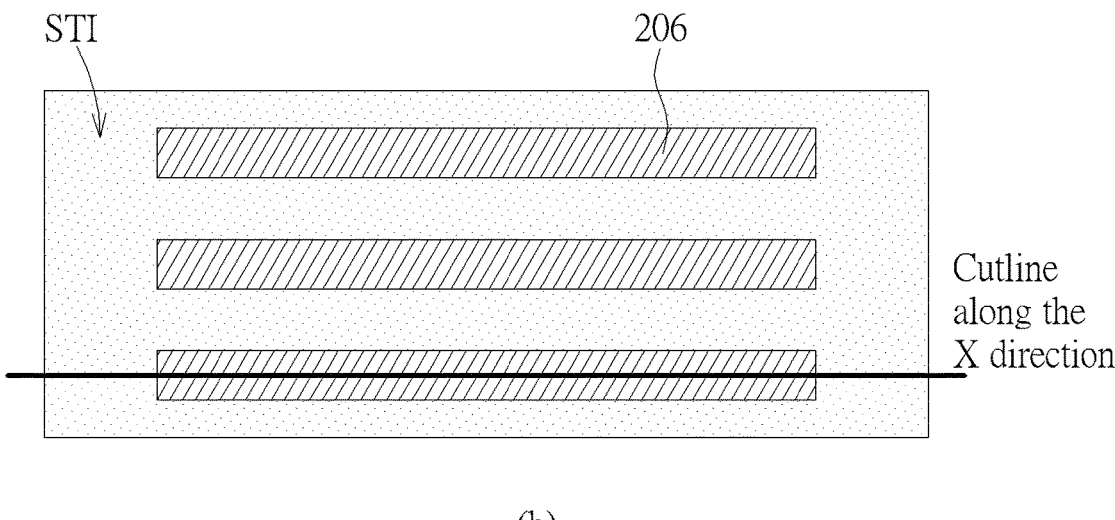

Please refer to FIG. 1B and FIG. 2. Step 15 could include:

Step 102: Deposit a pad-oxide layer 204 and a pad-nitride layer 206 over the horizontal silicon surface (hereinafter, "HSS") 208 of the substrate.

Step 104: Define the active regions of the memory array circuit, and remove parts of a substrate material (such as silicon material) corresponding to the horizontal silicon surface 208 outside the active regions to create trench 210.

Step 106: Deposit an oxide layer 214 in the trench 210 and etched back the oxide layer 214 to form the shallow trench isolation (STI) below the horizontal silicon surface 208.

Figure 1C:
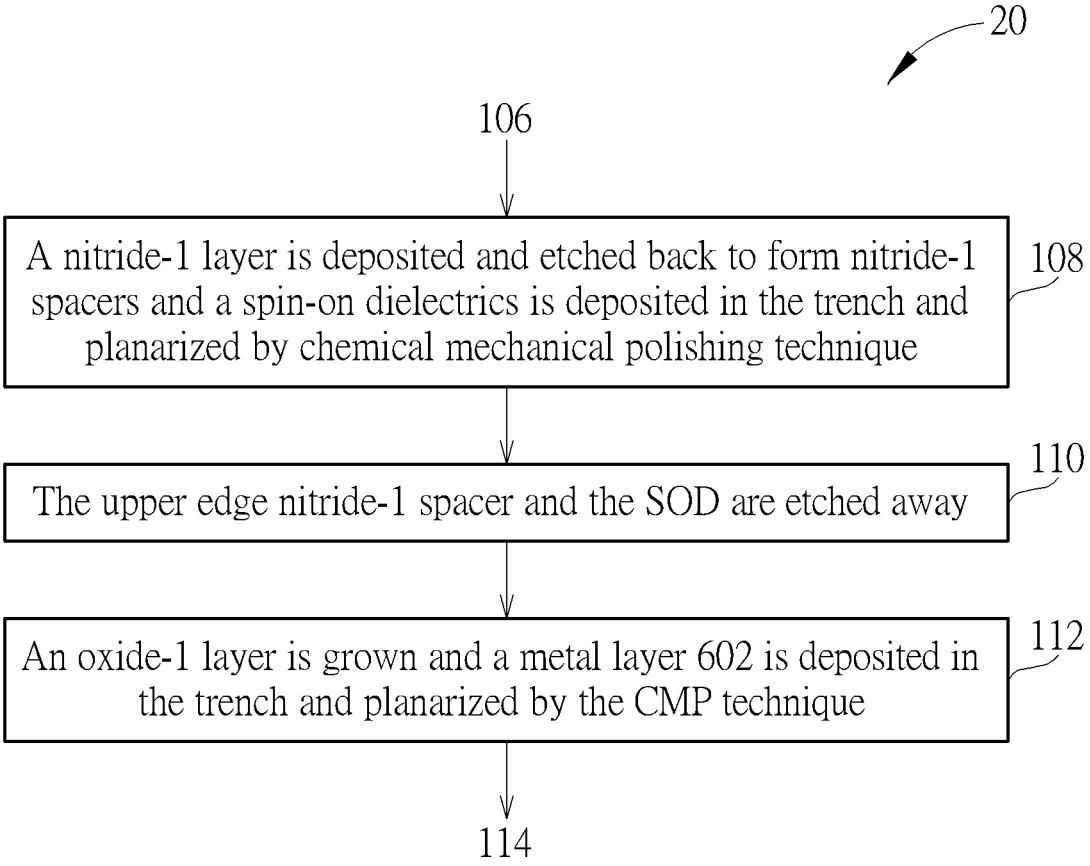
Figure 3:
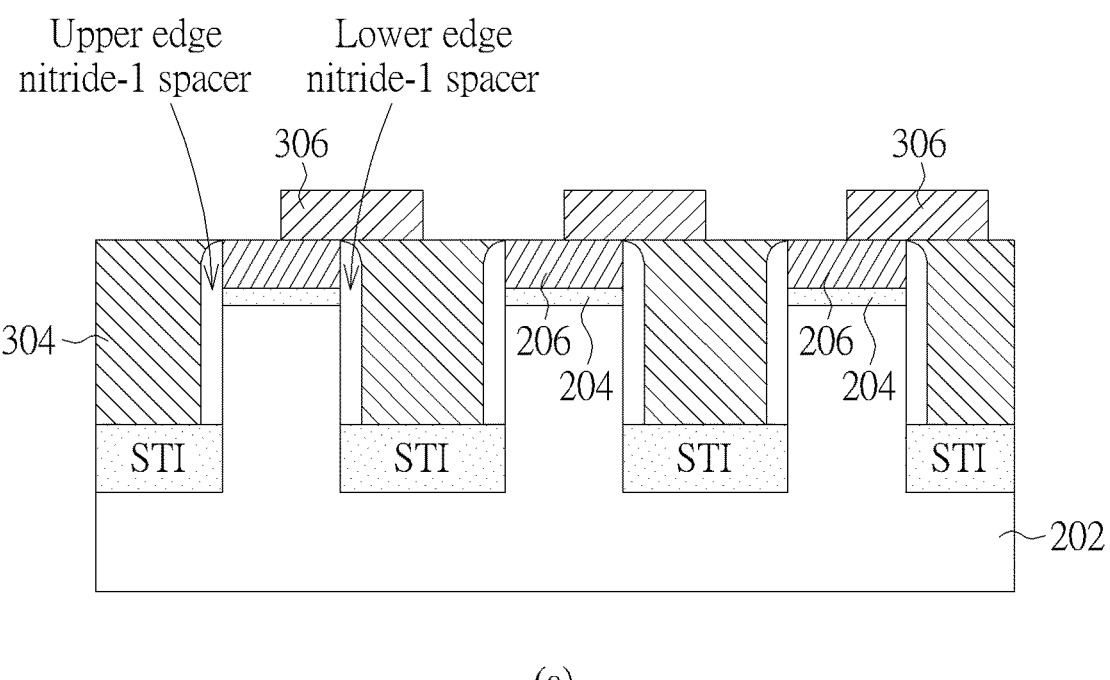
FIG. 3 is a diagram illustrating depositing and etching back the nitride-1 layer to form nitride-1 spacers, and depositing and polishing the SOD.
Figure 3:
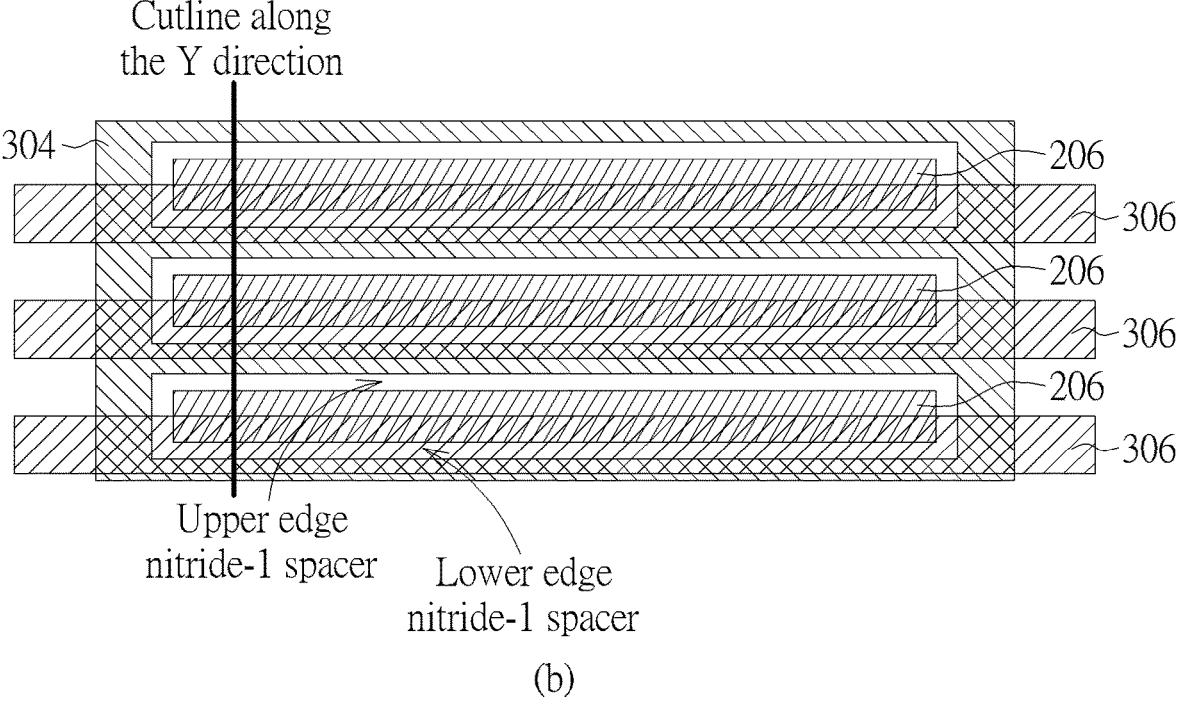
Figure 4:
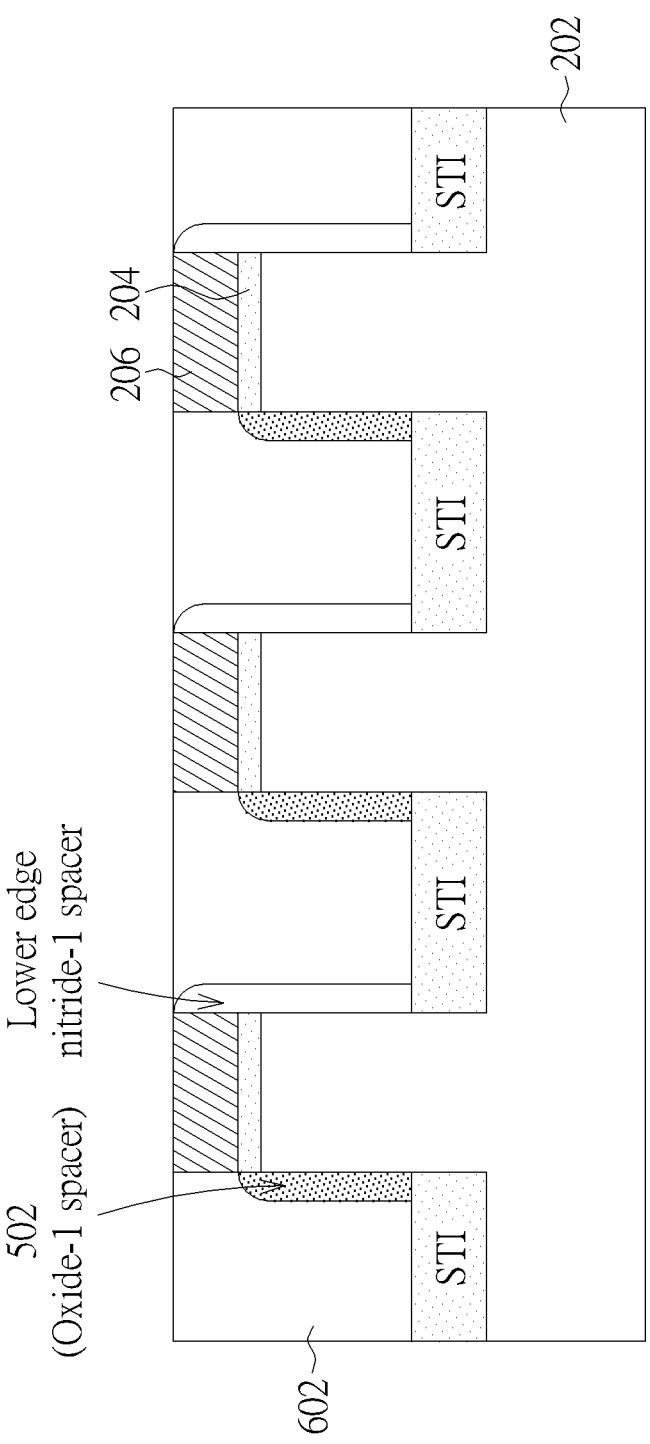
FIG. 4 is a diagram illustrating etching away the upper edge nitride-1 spacer and the SOD, growing the oxide-1 layer, and depositing the metal layer.

Please refer to FIG. 1C and FIG. 3, FIG. 4. Step 20 could include:

Step 108: A nitride-1 layer is deposited and etched back to form nitride-1 spacers and a spin-on dielectrics (SOD) 304 is deposited in the trench 210 and planarized by chemical mechanical polishing (CMP) technique (FIG. 3).

Step 110: The upper edge nitride-1 spacer and the SOD 304 are etched away (FIG. 4).

Step 112: An oxide-1 layer 502 is grown, such as thermal growth, and a metal layer 602 is deposited in the trench 210 and planarized by the CMP technique (FIG. 4).

Figure 1D:
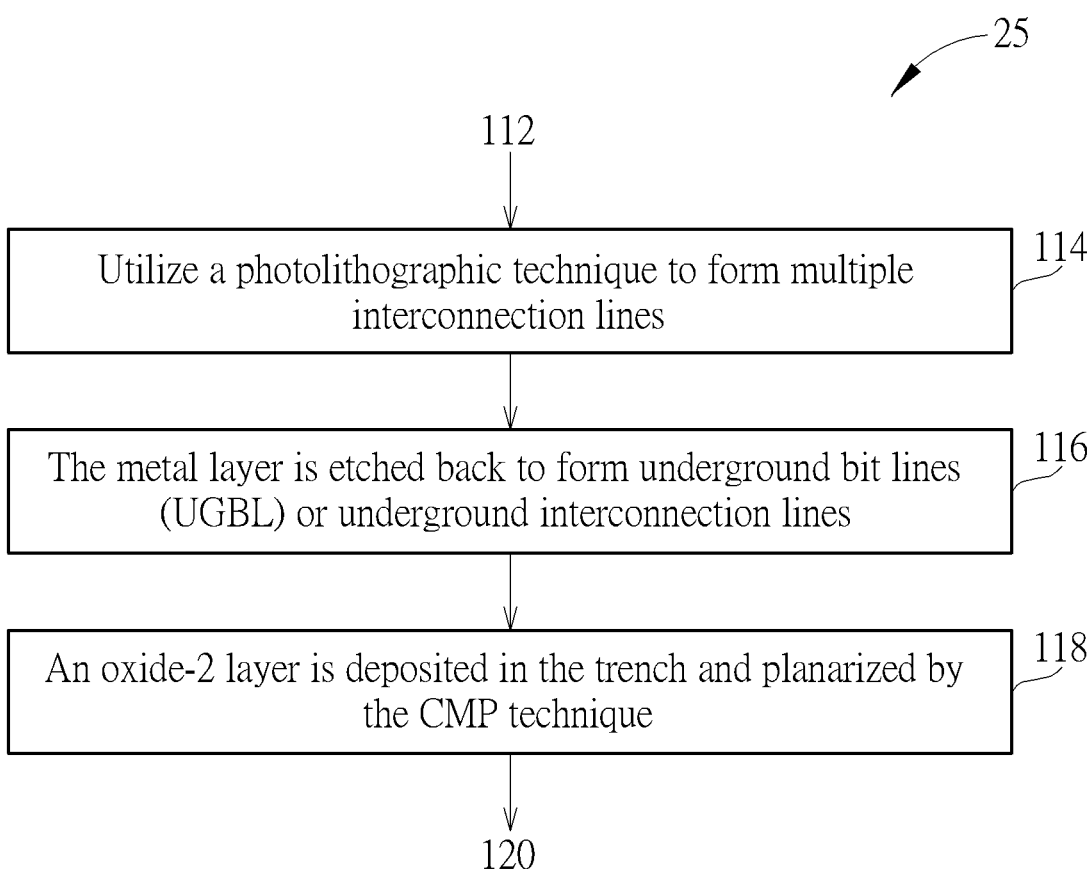
Figure 5:
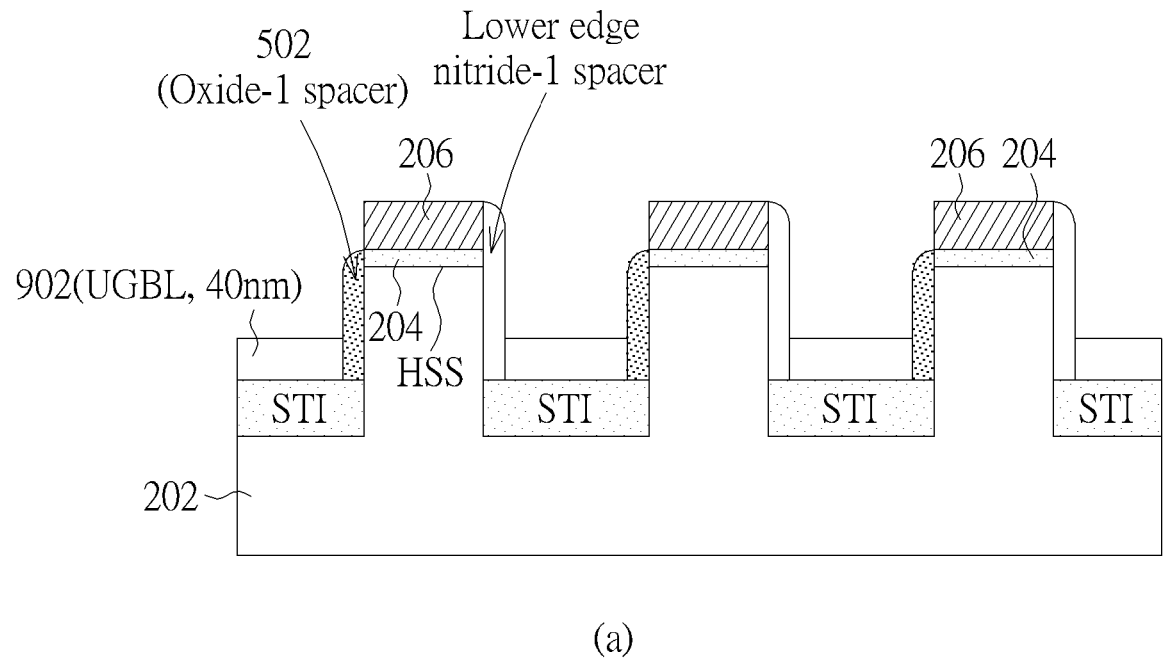
FIG. 5 is a diagram illustrating etching back the metal layer to form the underground bit line.
Figure 5:
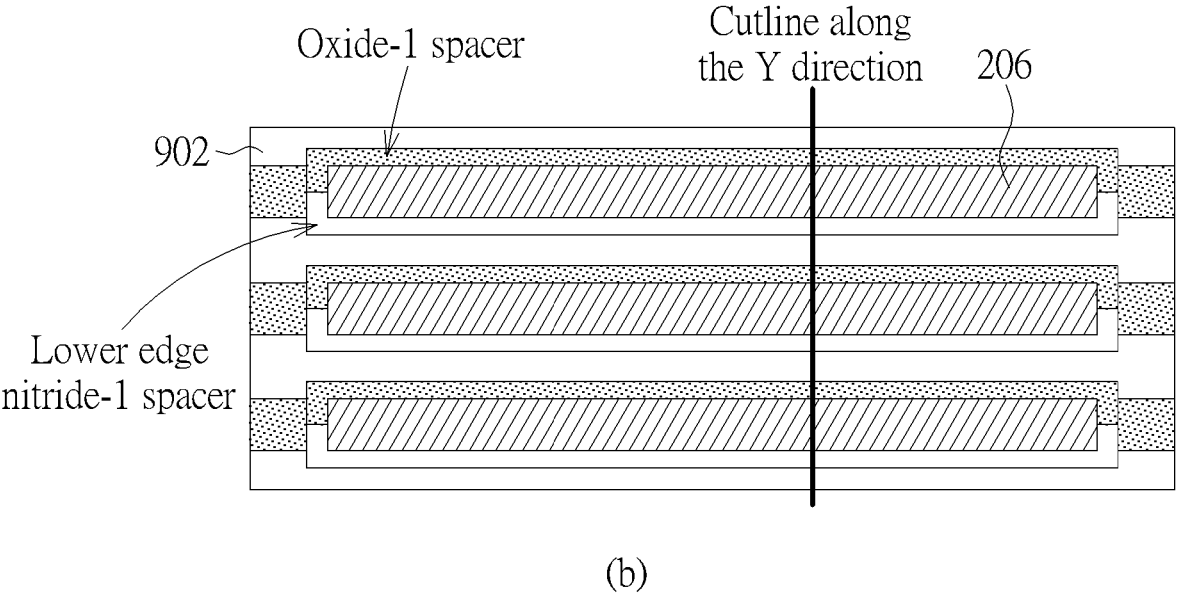
Figure 6:
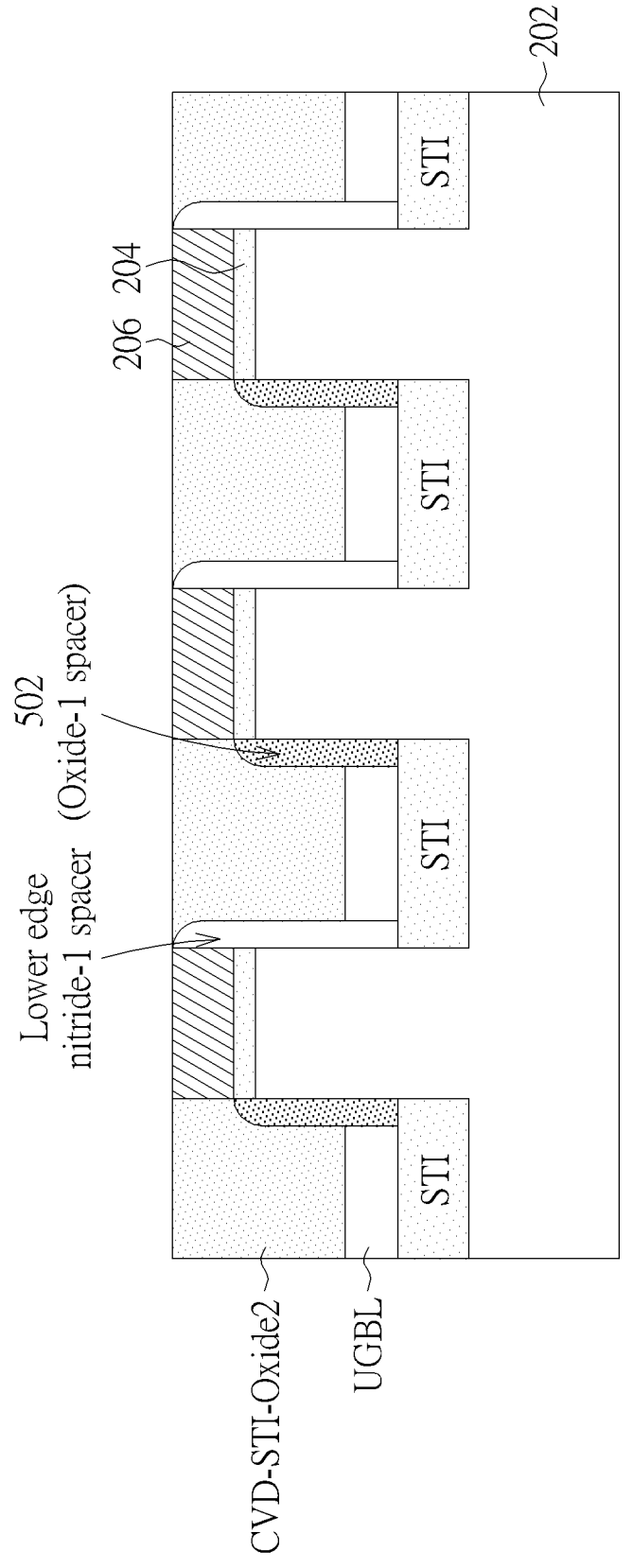
FIG. 6 is a diagram illustrating the oxide-2 layer being deposited in the trench and planarized by the CMP technique.

Please refer to FIG. 1D and FIG. 5, FIG. 6. Step 25 could include:

Step 114: Utilize a photolithographic technique to form multiple interconnection (the metal layer 602) lines (FIG. 5).

Step 116: The metal layer 602 (the multiple interconnection lines) is etched back to form underground bit lines (UGBL) 902 or underground interconnection lines (FIG. 5).

Step 118: An oxide-2 layer 1002 is deposited in the trench 210 and planarized by the CMP technique (FIG. 6).

Figure 1E:
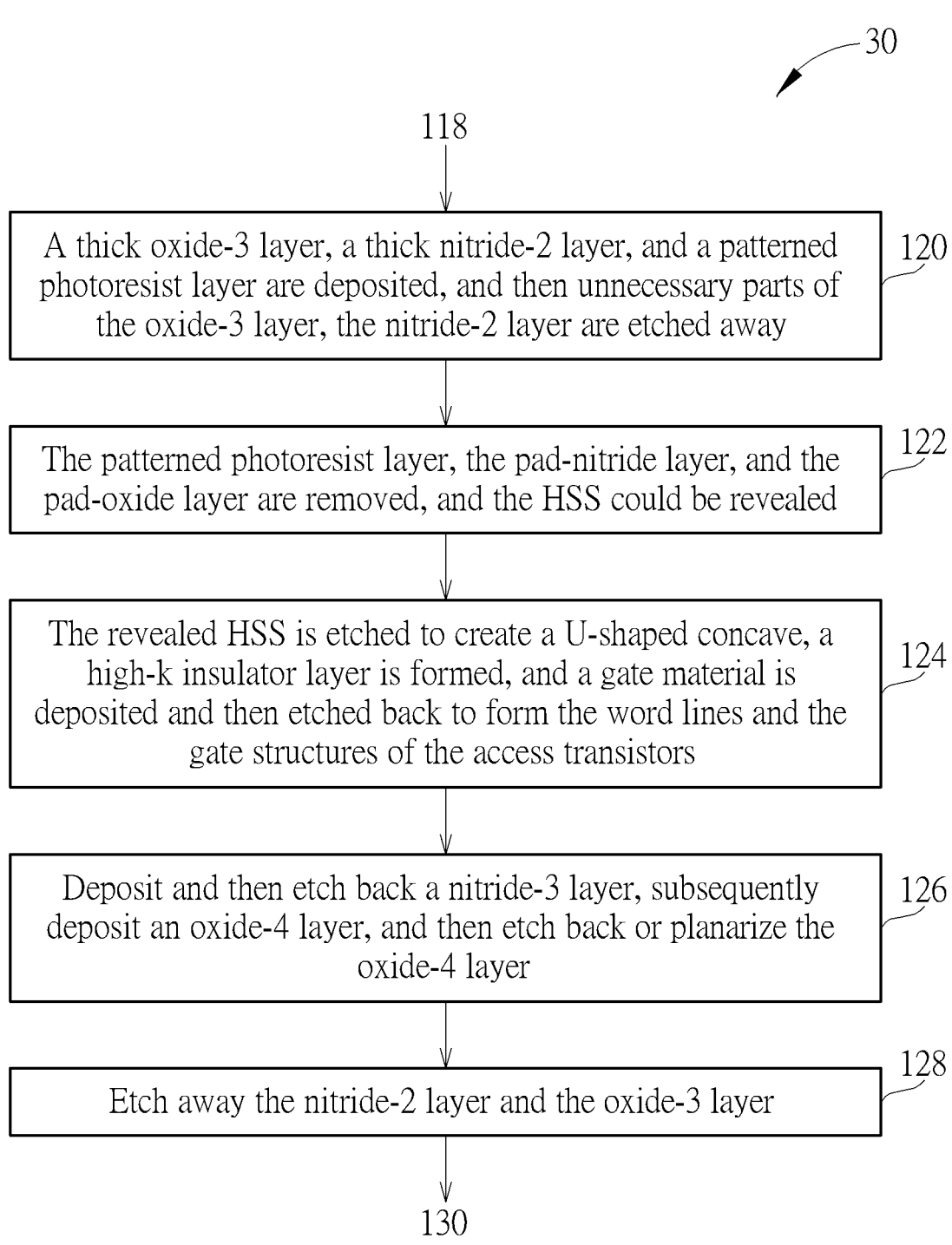
Figure 7:
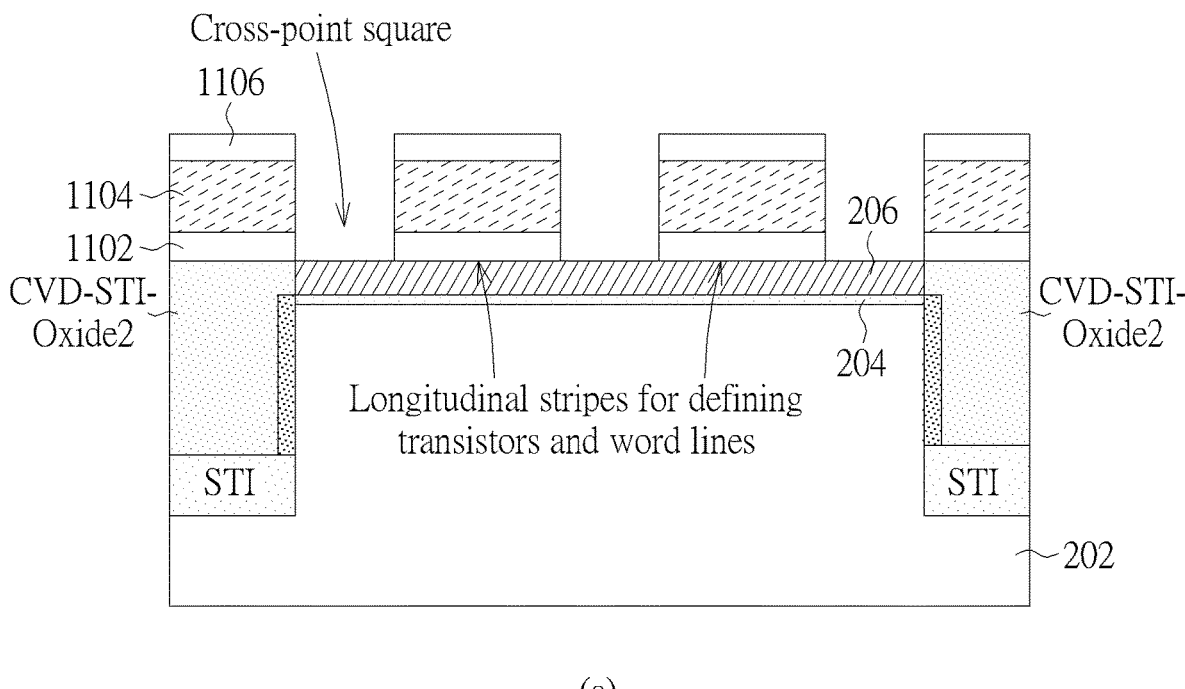
FIG. 7 is a diagram illustrating the oxide-3 layer, the nitride-2 layer, and the patterned photoresist layer being deposited, and then the unnecessary parts of the oxide-3 layer, the nitride-2 layer, and the patterned photoresist layer being removed.
Figure 8:
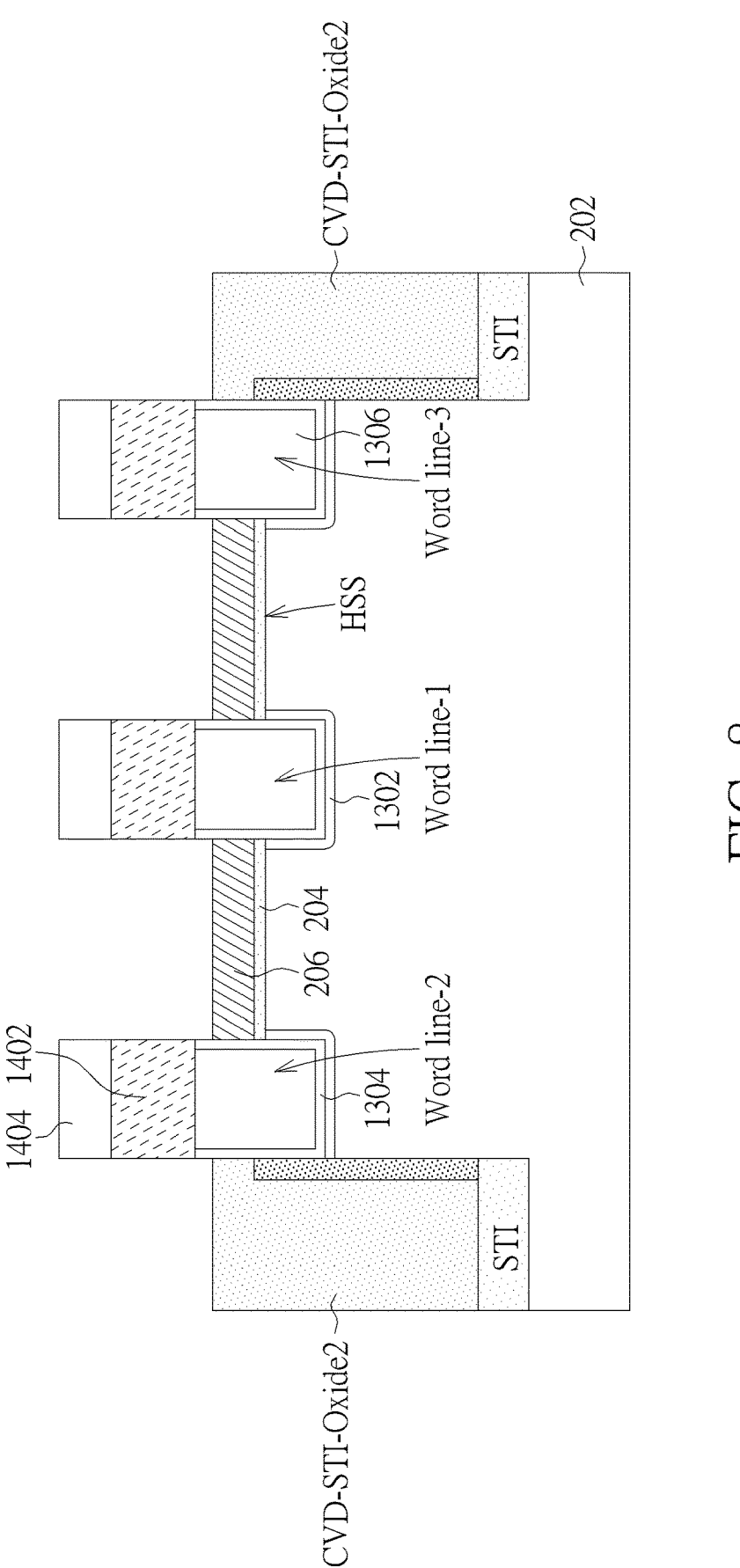
FIG. 8 is a diagram illustrating creating the U-shaped concave, the high-k insulator layer being formed, the gate material being deposited and then etched back to form the word lines and the gate structures of the access transistors, the nitride-3 layer and the oxide-4 layer being deposited and then polishing back the nitride-3 layer and the oxide-4 layer, and the nitride-2 layer and the oxide-3 layer being etched away.

Please refer to FIG. 1E and FIG. 7, FIG. 8. Step 30 could include:

Step 120: A thick oxide-3 layer 1102, a thick nitride-2 layer 1104, and a patterned photoresist layer 1106 are deposited, and then unnecessary parts of the oxide-3 layer 1102, the nitride-2 layer 1104 are etched away (FIG. 7).

Step 122: The patterned photoresist layer 1106, the pad-nitride layer 206, and the pad-oxide layer 204 are removed, and the HSS could be revealed (FIG. 7).

Step 124: The revealed HSS is etched to create a U-shaped concave, a high-k insulator layer 1304 is formed, and a gate material 1306 (such as Tungsten) is deposited and then etched back to form the word lines and the gate structures of the access transistors. Such access transistor could be named as U-transistor (FIG. 8).

Step 126: Deposit and then etch back a nitride-3 layer 1402, subsequently deposit an oxide-4 layer 1404, and then etch back or planarize the oxide-4 layer 1404 (FIG. 8).

Step 128: Etch away the nitride-2 layer 1104 and the oxide-3 layer 1102 (FIG. 8).

Figure 1F:
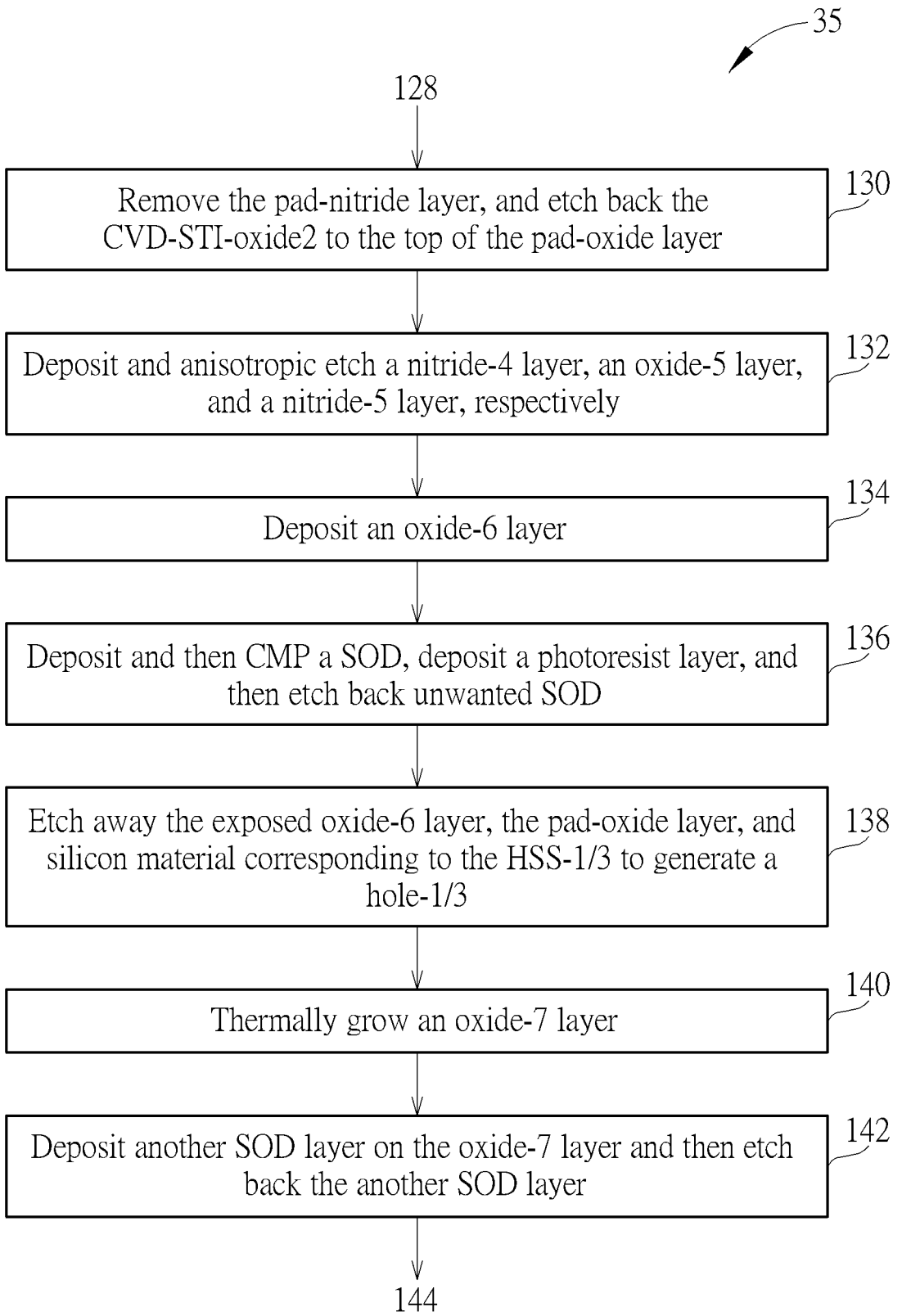
Figure 9:
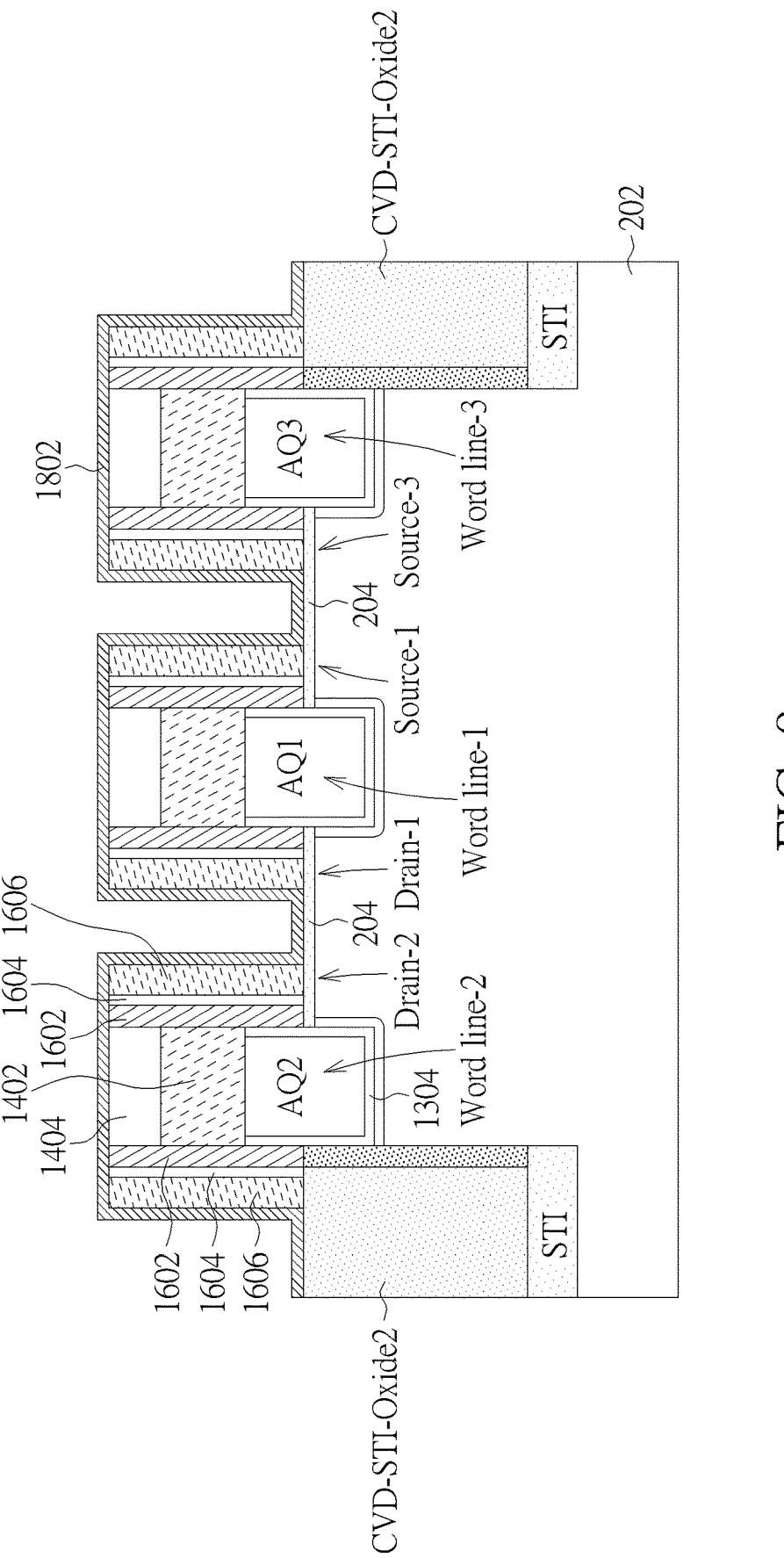
FIG. 9 is a diagram illustrating the pad-nitride layer being removed, the CVD-STI-oxide2 being etched back, the nitride-4 layer, the oxide-5 layer, the nitride-5 layer being deposited and etched, and the oxide-6 layer being deposited.
Figure 10:
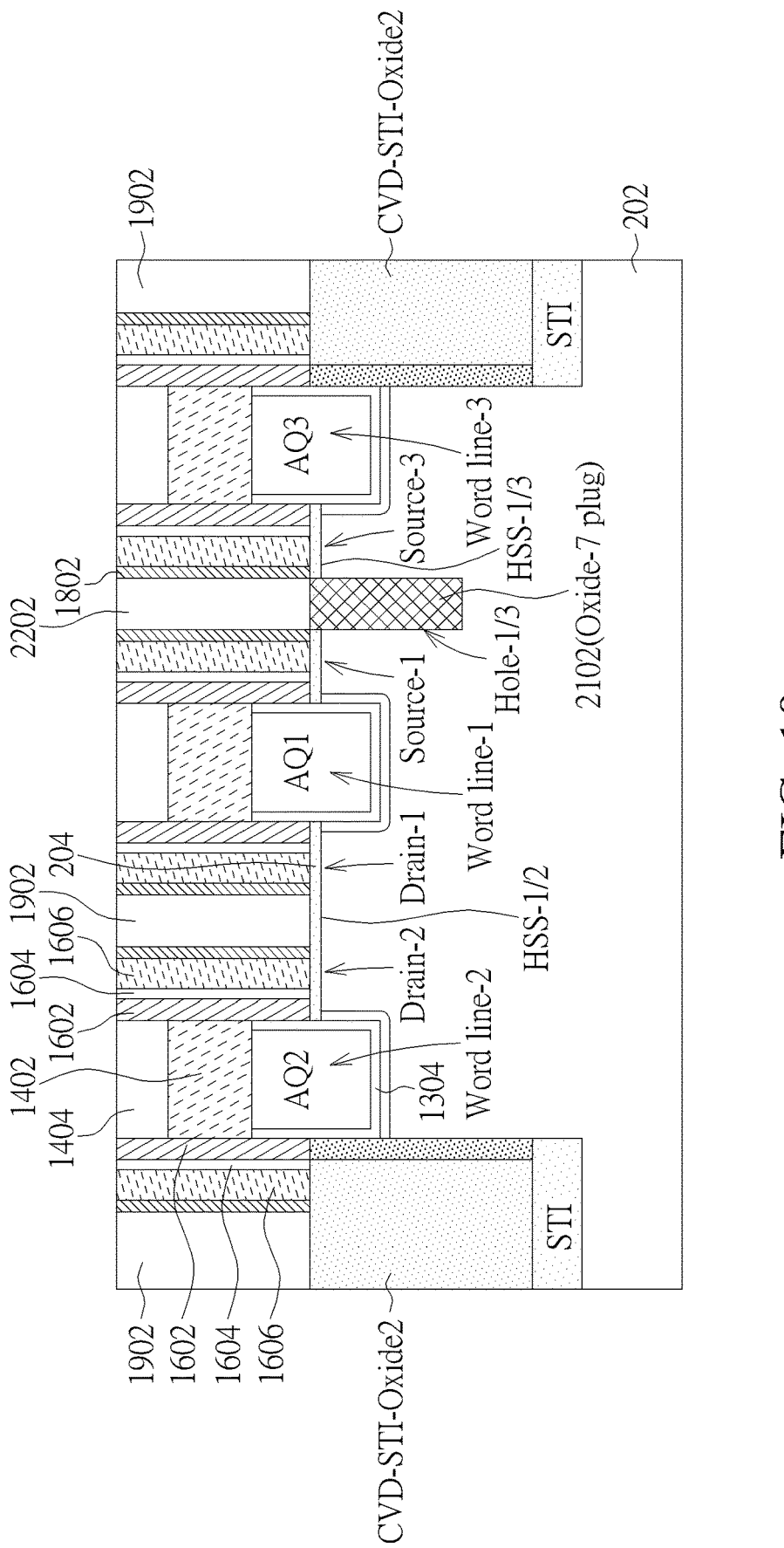
FIG. 10 is a diagram illustrating the SOD being deposited and polished, the photoresist layer being deposited, then the unwanted SOD being etched back, the exposed oxide-6 layer 1802, the pad-oxide layer 204, and silicon material corresponding to the HSS-1/3 being etched away to generate a hole-1/3, the oxide-7 layer being thermally grown, and the another SOD layer being deposited and etched back.

Please refer to FIG. 1F and FIG. 9, FIG. 10. Step 35 could include:

Step 130: Remove the pad-nitride layer 206, and etch back the CVD-STI-oxide2 to the top of the pad-oxide layer 204 (FIG. 9).

Step 132: Deposit and anisotropic etch a nitride-4 layer 1602, an oxide-5 layer 1604, and a nitride-5 layer 1606, respectively (FIG. 9).

Step 134: Deposit an oxide-6 layer 1802 (FIG. 9).

Step 136: Deposit and then CMP a SOD 1902, deposit a photoresist layer, and then etch back unwanted SOD 1902 (FIG. 10).

Step 138: Etch away the exposed oxide-6 layer 1802, the pad-oxide layer 204, and silicon material corresponding to the HSS-1/3 to generate a hole-1/3 (FIG. 10).

Step 140: Thermally grow an oxide-7 layer 2102 (FIG. 10).

Step 142: Deposit another SOD layer 2202 on the oxide-7 layer 2102 and then etch back the another SOD layer 2202 (FIG. 10).

Figure 11:
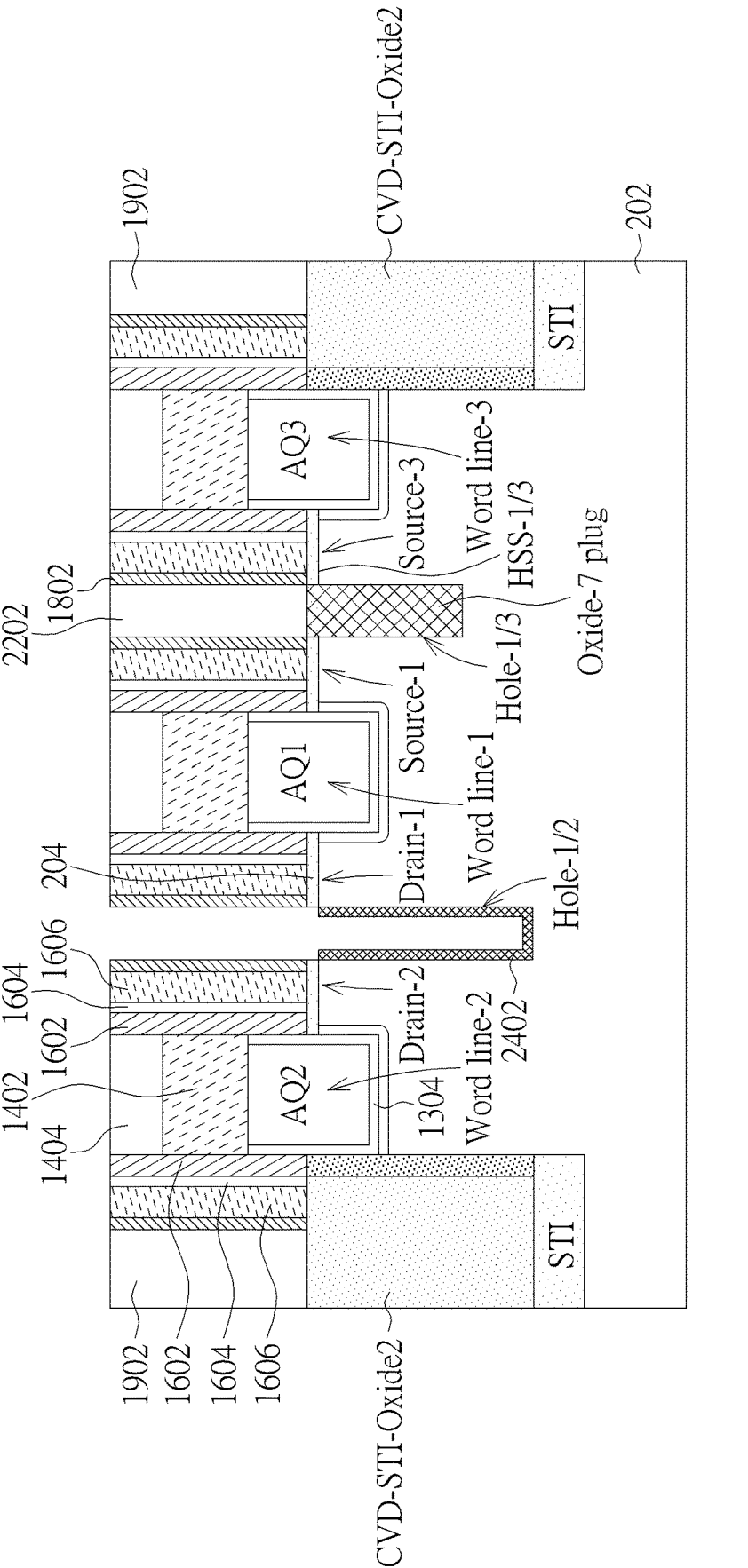
FIG. 11 is a diagram illustrating removing the exposed SOD, the exposed oxide-6 layer, and the exposed pad-oxide layer, then digging and removing the silicon material corresponding to the HSS-1/2 to generate a hole-1/2, and growing the oxide-8 layer thermally.

Please refer to FIG. 1G and FIG. 11, FIG. 12, FIG. 13, FIG. 14, FIG. 15, FIG. 16. Step 40 could include:

Step 144: Remove the exposed SOD 1902, the exposed oxide-6 layer 1802, and the exposed pad-oxide layer 204; and then dig and remove the silicon material corresponding to the HSS-1/2 to generate a hole-1/2 (FIG. 11).

Step 146: Grow an oxide-8 layer 2402 thermally (FIG. 11).

Figure 13:
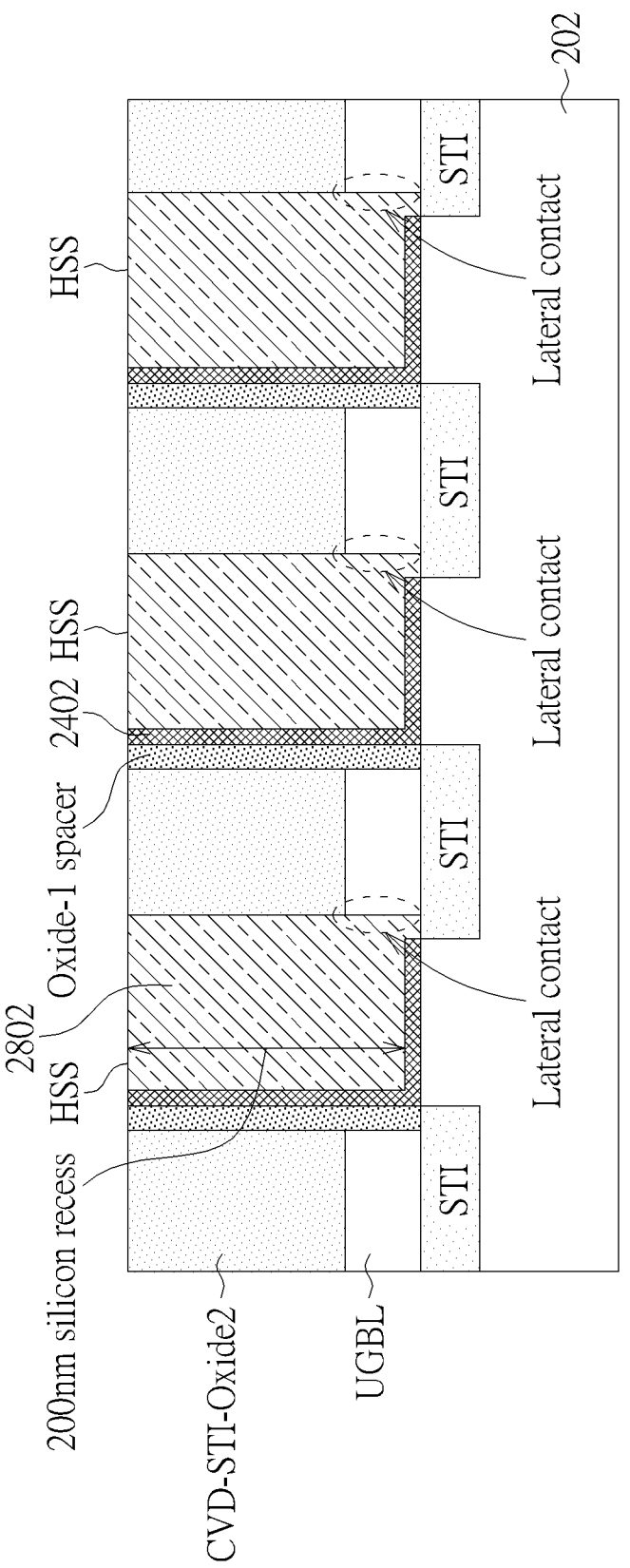
FIG. 13 is a diagram illustrating removing the lower edge nitride-1 spacer to reveal sidewall of the underground bit line, and depositing the n+ very heavily doped polysilicon film in the hole-1/2 to contact the sidewall of the UGBL.

Step 148: Remove the lower edge nitride-1 spacer to reveal sidewall of the underground bit line (FIG. 13).

Step 150: Deposit an n+ very heavily doped polysilicon film 2802 in the hole-1/2 to contact the sidewall of the UGBL (FIG. 13).

Figure 14:
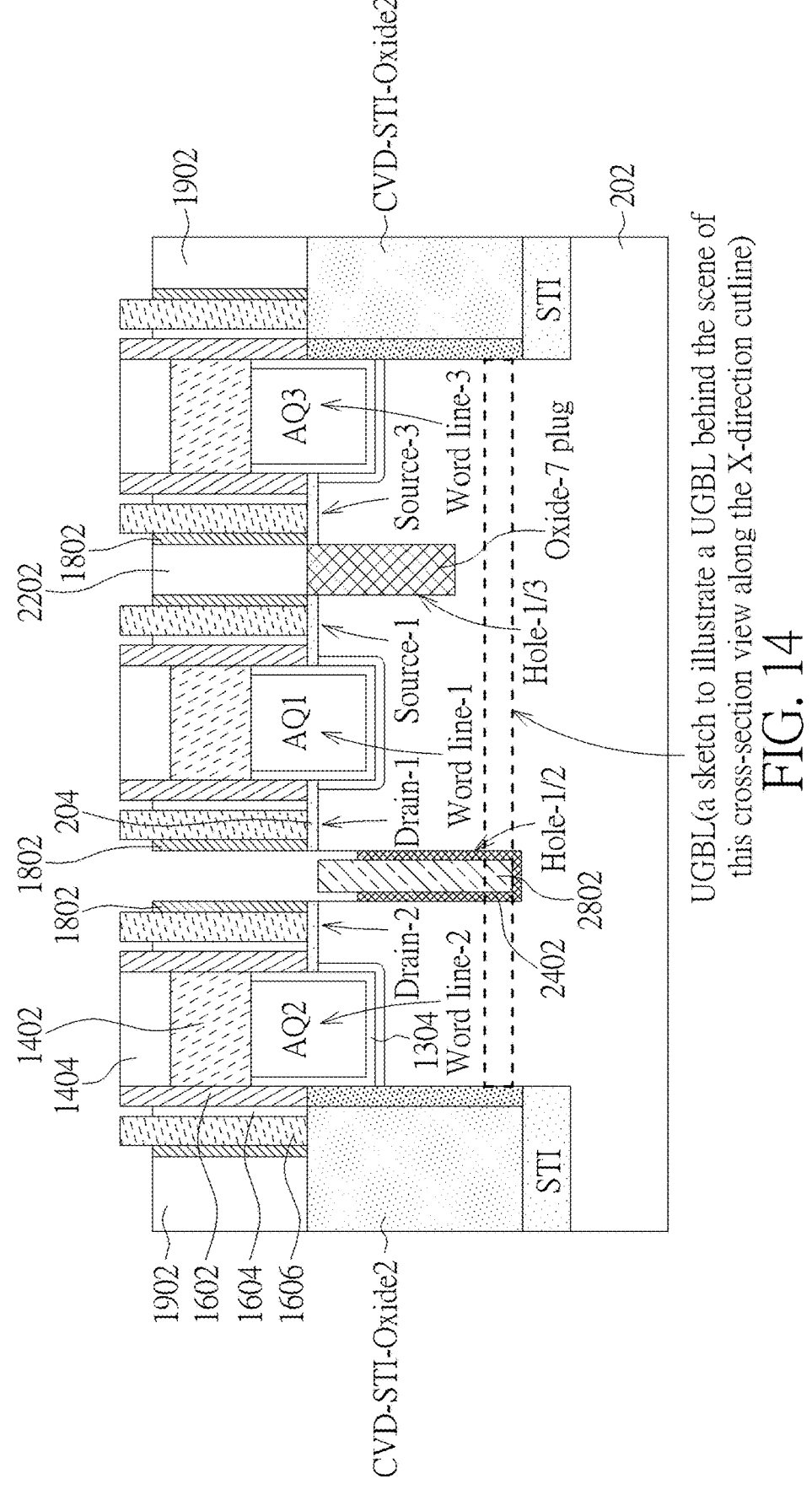
FIG. 14 is a diagram illustrating etching back the upper portion of the oxide-8 layer to reveal silicon material corresponding to the hole-1/2.

Step 152: Etch back an upper portion of the oxide-8 layer 2402 to reveal silicon material corresponding to the hole-1/2 (FIG. 14).

Figure 15:
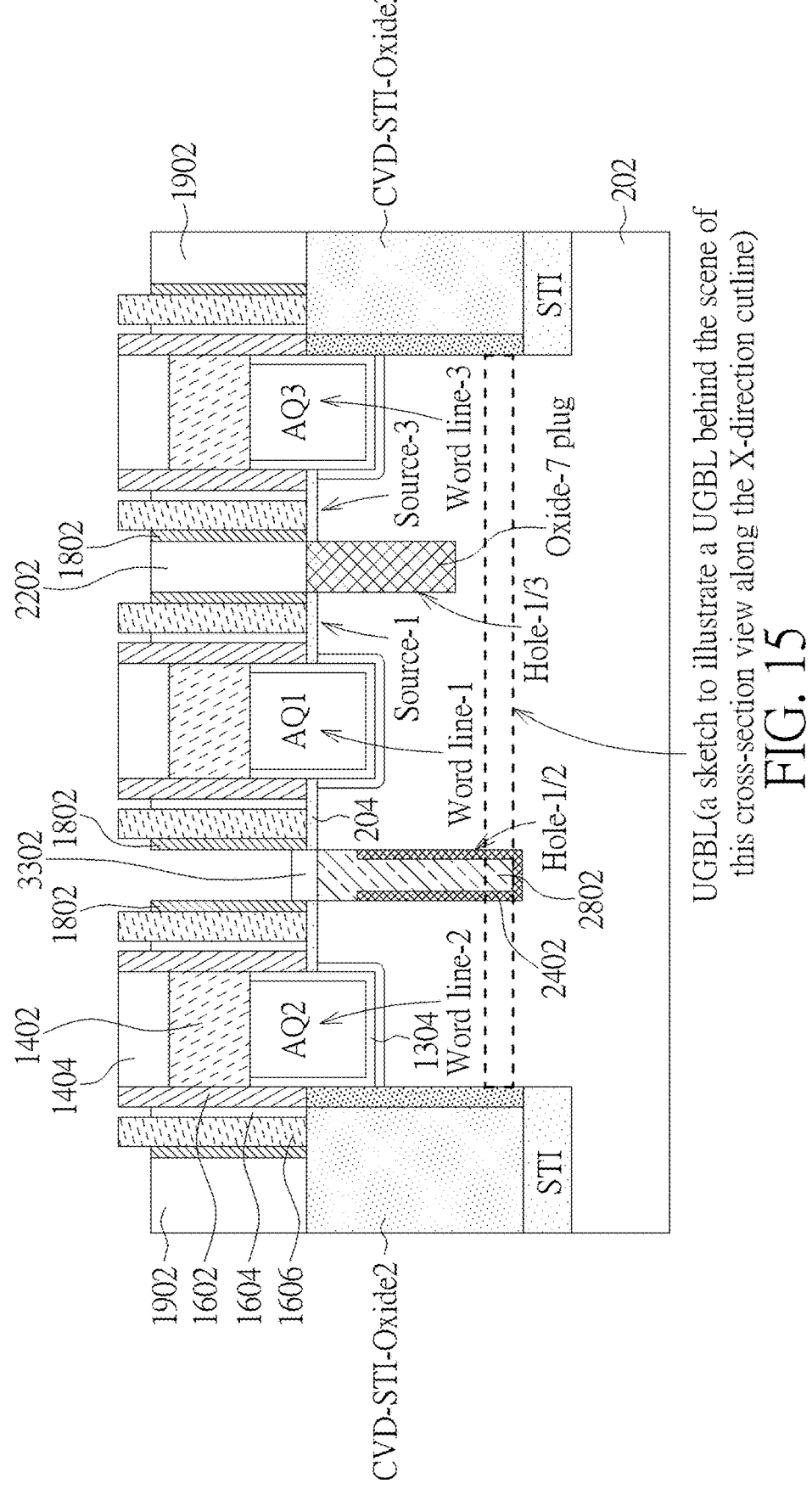
FIG. 15 is a diagram illustrating growing laterally the n+ polysilicon layer based on the revealed silicon material, and growing thermally an oxide-9 layer.

Step 154: Grow laterally an n+ polysilicon layer 3202 based on the revealed silicon material to contact the drain region and the n+ polysilicon plug (FIG. 15).

Step 156: Grow thermally an oxide-9 layer 3302 above the n+ polysilicon layer 3202 (FIG. 15).

The possible material of the metal layer used in the aforesaid process steps (such as shown in FIG. 5 for underground bit line, FIG. 10 for word line, electrodes and/or counter electrodes of the capacitor, etc.) could be Tungsten, but due to the sensitivity of Tungsten materials to oxide or oxidation process, it is better that the tungsten layer could be covered by another TiN layer or suitable layer. In this invention, detailed protection process for the tungsten layer is not described, but it is assumed that the metal layers including Tungsten layers are well treated to avoid any oxidation directly over it. Of course, there are some appropriate metal layers suitably used for Underground bit lines and word lines rather than be limited a specific type of metal material which is not suitably inserted in the integrated process.

Detailed description of the aforesaid manufacturing method is as follows. Start with a p-type silicon wafer (i.e. the p-type substrate 202). In Step 102, as shown in FIG. 2(*a*), the pad-oxide layer 204 is formed above a horizontal silicon surface 208 (i.e. named as a horizontal silicon surface (HSS) if the substrate is silicon substrate, hereinafter the horizontal silicon surface or HSS is used as example) and then the pad-nitride layer 206 is deposited above the pad-oxide layer 204.

In Step 104, the active regions of the memory array circuit can be defined by the photolithographic mask technique, wherein as shown in FIG. 2(*a*), the active regions of the memory array circuit correspond to the pad-oxide layer 204 and the pad-nitride layer 206, and the horizontal silicon surface 208 outside an active region pattern is exposed accordingly. Because the horizontal silicon surface 208 outside the active region pattern is exposed, the parts of the silicon material corresponding to the horizontal silicon surface 208 outside the active region pattern can be removed by an anisotropic etching technique to create the trench (or canal) 210, wherein for example, the trench 210 can be 250 nm deep below the HSS.

In Step 106, the oxide layer 214 is deposited to fully fill the trench 210 and then the oxide layer 214 is etched back such that the STI inside the trench 210 is formed below the HSS. In addition, as shown in FIG. 2(*a*), for example, the STI has a thickness about 50 nm and a top of the STI is about 200 nm deep below the HSS if the trench 210 is 250 nm deep below the HSS. In addition, FIG. 2(*b*) is a top view corresponding to FIG. 2(*a*), wherein FIG. 2(*a*) is a cross-section view along a cut line of an X direction shown in FIG. 2(*b*).

In Step 108, as shown in FIG. 3(*a*), the nitride-1 layer is deposited and etched back by the anisotropic etching so as to create the nitride-1 spacers along both edges (i.e. an upper edge and a lower edge) of the trench 210. In another embodiment of the present invention, the nitride-1 spacers could be replaced by SiOCN as one side spacer. Then, as shown in FIG. 3(*a*), the SOD 304 is deposited in the trench 210 above the STI to fill in the vacancies of the trench 210 above the STI. Then, the SOD 304 is planarized by the CMP technique to make a top of the SOD 304 as high as a top of the pad-nitride layer 206. In addition, FIG. 3(*b*) is a top view corresponding to FIG. 3(*a*), wherein FIG. 3(*a*) is a cross-section view along a cut line of a Y direction shown in FIG. 3(*b*).

In Step 110, as shown in FIG. 4, lower edge nitride-1 spacers of the nitride-1 spacers along the lower edge of the trench 210 are protected by utilizing the photolithographic mask technique, but upper edge nitride-1 spacers of the nitride-1 spacers along the upper edge of the trench 210 are unprotected. That is, after a photoresist layer (not shown in FIG. 4) is deposited above the SOD 304 and the pad-nitride layer 206, because a part of the photoresist layer above the upper edge nitride-1 spacer is removed but a part of the photoresist layer above the lower edge nitride-1 spacer is kept, the lower edge nitride-1 spacer can be protected and the upper edge nitride-1 spacer can be removed later.

In Step 112, as shown in FIG. 4, the upper edge nitride-1 spacer and the SOD 304 not covered by the photoresist layer are etched away by etching process. As shown in FIG. 4, both the photoresist layer and the SOD 304 are stripped off, wherein the SOD 304 has much higher etching rate than that of thermal oxide and some deposited oxide. Then, the oxide-1 layer 502 is grown thermally to form oxide-1 spacer to cover the upper edge of the trench 210. As shown in FIG. 4, Step 112 results in asymmetric spacers (the lower edge nitride-1 spacer and the oxide-1 spacer) on two symmetrical edges (the upper edge and the lower edge) of the trench 210, respectively. For example, a thickness of the oxide-1 spacer is 4 nm and a thickness of the lower edge nitride-1 spacer is 3 nm. In other words, the asymmetric spacers are formed along the sidewalls of active regions. A structure of the asymmetric spacers (shown in FIG. 4) and the above-mentioned related steps are key invention of the present invention, which is named as asymmetric spacers on two symmetrical edges of a trench or a canal (ASoSE).

In addition, as shown in FIG. 4, the metal layer 602 (e.g. a thin TiN plus metal Tungsten abbreviated as W) or a conductive material (e.g. doped polysilicon) which needs to sustain the subsequent processing conditions is deposited to fully fill the trench 210 and planarized by the CMP technique to make a top of the metal layer 602 be leveled off equally with the top of the pad-nitride layer 206.

Then, in Step 114, as shown in FIG. 5(*a*), utilize the photolithographic technique to form multiple conductive (e.g. TiN/Tungsten) lines. The metal layer 602 is etched back but left only a reasonable thickness inside the trench 210 to form the conductive line or the underground bit line (UGBL) 902, wherein a top of the underground bit line 902 is much lower than the HSS (e.g. a thickness of the underground bit line 902 is about 40 nm). In addition, as shown in FIG. 5(*a*), the underground bit line (UGBL) 902 is on the top of the STI and both sidewalls of the underground bit line (UGBL) 902 are bounded by the asymmetric spacers, that is, the lower edge nitride-1 spacer and the oxide-1 spacer, respectively. In addition, FIG. 5(*a*) is a cross-section view along the Y direction shown in FIG. 5(*b*).

In Step 118, as shown in FIG. 6 (the cross-section view along the Y direction shown in FIG. 5(*b*)), the oxide-2 layer 1002 (called as CVD-STI-oxide2) needs to be thick enough to fill the trench 210 over the underground bit line 902, and then the oxide-2 layer 1002 is polished back to reserve some part which is leveled as high as the top of the pad-nitride layer 206, and covers both the lower edge nitride-1 spacer and the oxide-1 spacer. As shown in FIG. 6, Step 118 can make the underground bit line 902 (i.e. an interconnection line) embedded and bounded by all insulators (i.e. an isolation region) inside the trench 210 (and later the underground bit line 902 will be connected to drains of access transistors of the memory array circuit) which is named as underground bit-lines (UGBL) surrounded by insulators. The UGBL is another key invention of the present invention.

The following descriptions introduce how to form both the access transistors and word lines of the memory array circuit and the word lines connect all associated gate structures of the access transistors. In Step 120, as shown in FIG. 7(*a*), first, the thick oxide-3 layer 1102, the thick nitride-2 layer 1104, and the patterned photoresist layer 1106 are deposited. Then, the unnecessary parts of the oxide-3 layer

1102 and the nitride-2 layer 1104 are removed by using photolithographic technique, but a transistor/word line pattern will be defined by the composite layers of the oxide-3 layer 1102 and the nitride-2 layer 1104, wherein the composite layers of the oxide-3 layer 1102 and the nitride-2 layer 1104 consists of multiple stripes in a direction perpendicular to a direction of the active region. Therefore, as shown in FIG. 7(a) and FIG. 7(b), longitudinal (the Y direction) stripes (the oxide-3 layer 1102 and the nitride-2 layer 1104) for defining the access transistors and word lines are formed, wherein the active region is located at cross-point square between the longitudinal stripes, and FIG. 7(a) is a cross-section view along the X direction shown in FIG. 7(b).

In Step 122, the photoresist layer 1106 is kept so as to the pad-nitride layer 206 is etched but the pad-oxide layer 204 is retained, and then both the photoresist layer 1106 and the pad-oxide layer 204 are removed. As a result, the horizontal silicon surface 208 (i.e. the HSS) is exposed at the cross-point squares corresponding to the active regions.

In Step 124, as shown in FIG. 8, the HSS exposed at the cross-point squares is etched by the anisotropic etching technique to create the concave (such as U-shape), wherein the U-shaped concave is for a U-shaped channel 1302 of the access transistor, and for example, a vertical depth of the U-shaped concave can be around 60 nm from the HSS. Since the U-shaped concave of the access transistor is exposed, a channel doping design can be achieved by somewhat well-designed boron (p-type dopant) concentration to dope the U-shaped channel 1302 of the U-shaped concave for a desired threshold voltage of the access transistor after a subsequent high-k metal-gate structure formation. The suitable high-k insulator layer 1304 is formed as a gate dielectric layer of the access transistor.

Afterwards select a suitable gate material 1306 that is appropriate for a word line conductance and can achieve a targeted work-function performance for the access transistor. Then, the gate material 1306 is thick enough to fill in the U-shape concaves, and the gate material 1306 is etched back to result in a longitudinal (the Y direction) word line, as shown in FIG. 8.

In Step 126, as shown in FIG. 8, the nitride-3 layer 1402 (i.e. dielectric cap) is deposited and the oxide-4 layer 1404 is subsequently deposited, wherein the nitride-3 layer 1402 and the oxide-4 layer 1404 are stacked up with total thickness being large enough to fill the vacancy between the two adjacent longitudinal stripes (the oxide-3 layer 1102 and the nitride-2 layer 1104) and ended up a flat surface. Then, the oxide-4 layer 1404 and the nitride-3 layer 1402 are etched back (or polished back) to be leveled off to a top of the nitride-2 layer 1104 so as to form a composite stack composed of the oxide-4 layer 1404 and the nitride-3 layer 1402 directly above the word line (i.e. the gate material 1306).

In Step 128, as shown in FIG. 8, the nitride-2 layer 1104 is etched away by the anisotropic etching technique and the oxide-4 layer 1404/the nitride-3 layer 1402 are left on the top of the word line. Then, the oxide-3 layer 1102 is also etched away by the anisotropic etching to expose the pad-nitride layer 206. The gate structure (such as, the oxide-4 layer 1404/the nitride-3 layer 1402/the gate material 1306) is achieved for both the gates of the U-transistors inside the U-shaped concave and the word lines (word line-1, word line-2, and word line-3) in the longitudinal direction (i.e. the Y direction).

In Step 130, as shown in FIG. 9, the pad-nitride layer 206 is removed everywhere to leave the pad-oxide layer 204.

The CVD-STI-oxide2 (i.e., the oxide-2 layer 1002) is etched back to be leveled as high as the top of the pad-oxide layer 204.

Then, in Step 132, as shown in FIG. 9, the nitride-4 layer 1602 is deposited and etched by the anisotropic etching technique to create nitride-4 spacer with well-designed suitable thickness. Then, the oxide-5 layer 1604 is deposited and etched by the anisotropic etching technique to create an oxide-5 spacer. Then, the nitride-5 layer 1606 is deposited over the entire surface and etched by the anisotropic etching technique to create nitride-5 spacer to make the nitride-5 spacer surround the gates (e.g. the gate-1, the gate-2, the gate-3).

As shown in FIG. 9, for convenience and clarity of describing the memory array circuit with word lines and bit lines, the word line located at a center is labeled the word line-1 (corresponding to the access transistor AQ1), the word line next to a left side of the word line-1 is labeled the word line-2 (corresponding to an access transistor AQ2 next to a left side of the access transistor AQ1), and drain region (drain-1 and drain-2) between the word line-1 and the word line-2 still covered by the pad-oxide layer 204 are reserved for the drain of the access transistor AQ1 and a drain of the access transistor AQ2. The word line next to a right side of the word line-1 is labeled the word line-3 (corresponding to an access transistor AQ3 next to a right side of the access transistor AQ1), and source region (source-1 and source-3) between the word line-1 and the word line-3 still covered by the pad-oxide layer 204 are reserved for the source of the access transistor AQ1 and a source of the right access transistor AQ3. Then, in Step 134, the oxide-6 layer 1802 is deposited over an entire surface shown in FIG. 9.

In Step 136, as shown in FIG. 10, the SOD 1902 is deposited which is thick enough to fill into the vacancies among all word lines and then the SOD 1902 is polished back to a flat level with a top of the oxide-6 layer 1802. Then, apply the photoresist layer on the flat surface to cover an area reserved for the drain region (i.e. the drain-1 and the drain-2) and to expose an area reserved for the source region (i.e. the source-1 and the source-3). Then, as shown in FIG. 10, the SOD 1902 corresponding to the areas reserved for the source region is removed by utilizing the oxide-6 layer 1802 surrounding all word lines as a self-alignment mask.

Then, in Step 138, as shown in FIG. 10, the exposed oxide-6 layer 1802 and the pad-oxide layer 204 at a center of the source region between two word lines (the word line-1 and the word line-3) are etched away so as to expose the HSS. Because the exposed HSS is located between the source-1 of the access transistor AQ1 and the source-3 of the access transistor AQ3, the exposed HSS between the source-1 and the source-3 can be called as HSS-1/3. As shown in FIG. 10, the HSS-1/2 between the word line-1 and the word line-2 will be used as a location for the drain-1 (i.e. the drain of the access transistor AQ1) and the drain-2 (i.e. the drain of the access transistor AQ2), and also as a location for connecting the access transistors AQ1, AQ2 vertically to the UGBL. In addition, on the other right side of the word line-1, the HSS-1/3 between the word line-1 and the word line-3 will be used for the source-1 (i.e. the source of the access transistor AQ1) and the source-3 (i.e. the source of the access transistor AQ3), but the source-1 and the source-3 are separate and cannot be connected as the source-1 and the source-3 will later be connected to extra cell storage nodes CSN1, CSN3 (not shown in FIG. 10), respectively.

In addition, the photolithographic mask technique is used above to cover the HSS-1/2, but a mask utilized by the photolithographic mask technique is not a critical mask and the only function is to allow treating the HSS-1/3 separately from processing over the HSS-1/2. As stated in the above, the SOD 1902 is deposited to be thick enough for making a smooth surface topography and then the photoresist layer is deposited to act as mask material to protect the SOD 1902 covering the drain region (the drain-1 and the drain-2) but expose the source region (the source-1 and the source-3).

As shown in FIG. 10, the silicon material (corresponding to the center of the source region) below the HSS-1/3 is dug by the anisotropic etching technique to generate the hole-1/3 (e.g. as deep as 140 nm) which is surrounded by the lower edge nitride-1 spacer and the oxide-1 spacer on two opposite sides (not shown in FIG. 10) and by the silicon substrate 202 on the other two opposite sides, respectively.

Then, in Step 140, as shown in FIG. 10, the oxide-7 layer 2102 is grown thermally to fill the hole-1/3 and use an isotropic etch precisely to remove all the oxide-7 layer over the HSS but leave this newly formed oxide-7-vertical-isolaton to fill the Hole-1/3. The oxide-7 layer 2102 filling the hole-1/3 is called as oxide-7 plug which has a smooth surface leveled as high as the top of the pad-oxide layer 204.

Then, in Step 142, as shown in FIG. 10, the another SOD layer 2202 is deposited, wherein the another SOD layer 2202 is thick enough to fill into the vacancy on a top of the oxide-7 layer 2102 in the hole-1/3, and top material of the another SOD layer 2202 is removed by the CMP technique until a top of the another SOD layer 2202 is leveled off as high as a top of the oxide-4 layer 1404.

In Step 144, as shown in FIG. 11, use a photolithography masking method to cover the area corresponding to the source region and to expose the area reserved for the drain region, wherein a mask utilized in Step 144 is not a critical mask and the only function is to allow processing on the HSS-1/2 separately from the processing over the HSS-1/3). Then, the exposed SOD 1902, the exposed oxide-6 layer 1802, and the exposed pad-oxide layer 204 underneath are removed in order to expose the HSS (i.e. the HSS-1/2). Then, the silicon material corresponding to the HSS-1/2 is dug and removed by the anisotropic etching to generate the hole-1/2 (e.g. as deep as 200 nm), wherein the hole-1/2 is physically surrounded by two opposite sides of the silicon substrate 202, respectively, the third side by the lower edge nitride-1 spacer, and the fourth side by the oxide-1 spacer, and both the third side and the fourth side are further bounded outside by the CVD-STI-oxide2 (not shown in FIG. 11).

Figure 12:
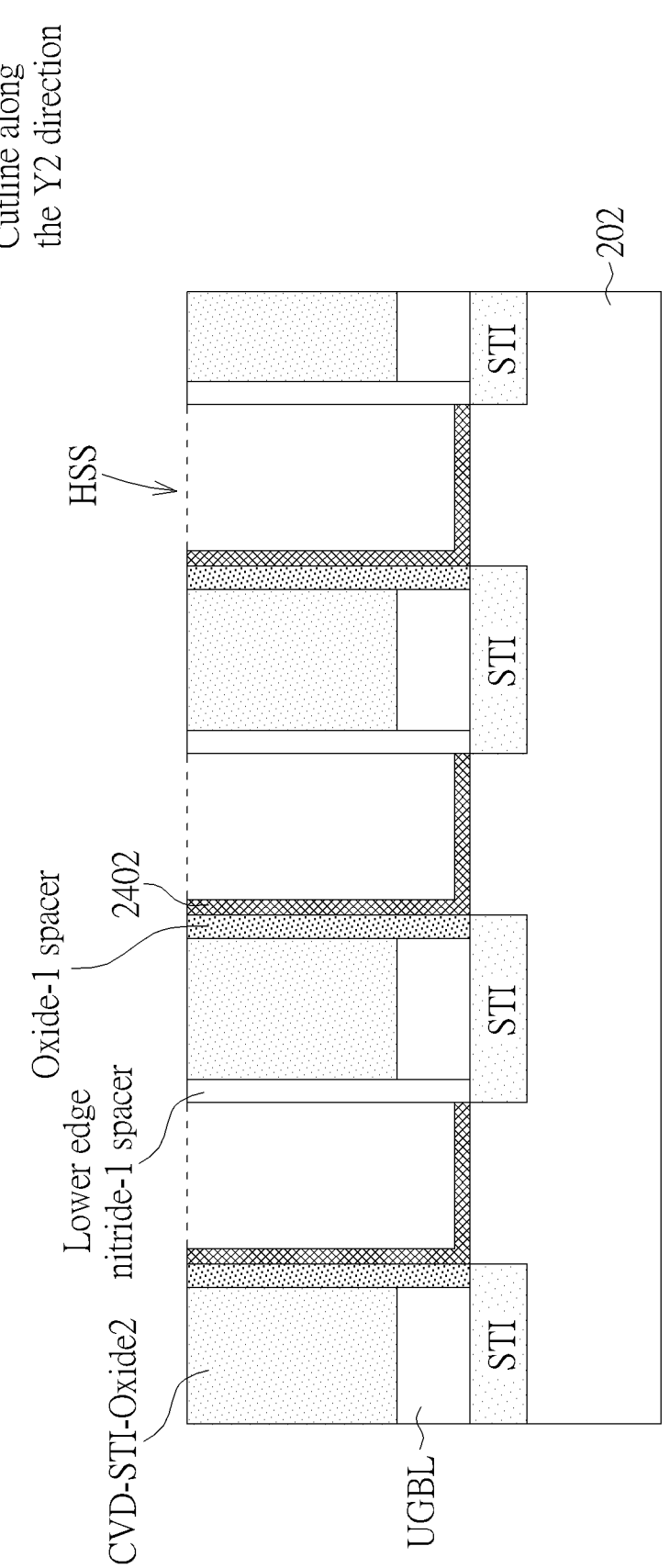
FIG. 12 is a diagram illustrating the cross-section view of the memory array circuit along a Y2 direction which is extended along the center of the hole-1/2 and perpendicular to the X direction.

Then, in Step 146, as shown in FIG. 11, the mask is removed and the oxide-8 layer 2402 is thermally grown to generate an oxide-8 spacer to cover three inner sidewalls of four sidewalls of the hole-1/2 and a bottom of the hole-1/2 except the third sidewall covered by the lower edge nitride-1 spacer. In addition, FIG. 12 is a diagram illustrating a cross-section view of the memory array circuit along a Y2 direction which is extended along the center of the hole-1/2 and perpendicular to the X direction.

Then, in Step 148, as shown in FIG. 13, the lower edge nitride-1 spacer on the third sidewall inside the hole-1/2 is removed by the isotropic etching technique (since the lower edge nitride-1 spacer is so thin so that the isotropic etching technique should not hurt the other structures over the HSS as the oxide-6 layer 1802 is also a good protection the nitride-5 spacer, and should neither remove the oxide-8 layer 2402 inside the hole-1/2).

Then, in Step 150, as shown in FIG. 13, the n+ very heavily doped polysilicon film 2802 is deposited, wherein the n+ doped polysilicon film 2802 is thick enough to fill in the hole-1/2 and then all the n+ doped polysilicon film 2802 over the HSS is etched back by the isotropic etching technique to leave an n+ polysilicon plug inside the hole-1/2, and the n+ polysilicon plug is connected with the UGBL through its opening at the third sidewall of the hole-1/2 which was originally covered by the lower edge nitride-1 spacer.

As shown in FIG. 13, the n+ polysilicon plug is connected to the UGBL from its sidewall of the n+ polysilicon plug to the lower W interconnection sidewall inside the hole-1/2, both are conductive materials to be connected in a sidewall self-alignment way, but is kept fully isolated by the oxide-8 layer 2402 from the substrate silicon material. Such n+ polysilicon plug is a vertical interconnection line, or an interconnection line extends upward or downward.

Then, in Step 152, as shown in FIG. 14, the upper portion of the oxide-8 layer 2402 is removed by a well-designed amount (such as a height of 20 nm below the HSS) through the anisotropic etching technique, resulting in the oxide-8 spacer having a lower height than a height of the n+ polysilicon plug accordingly.

Then, in Step 154, as shown in FIG. 15, use the selective epitaxy technique to grow a thin layer of the n+ polysilicon layer 3202 by using the silicon seeds provided by n+ polysilicon plug, thus resulting in a necklace-type surrounding conductive n+ polysilicon (named as n+ collar) connecting to the HSS on two sides of the hole-1/2 as the drain-1 and the drain-2 of the access transistors AQ1, AQ2, respectively, and also as a conductive bridge between the UGBL and the access transistors AQ1, AQ2.

Then, as shown in FIG. 15, the oxide-9 layer 3302 with a well-designed thickness is thermally grown locally over the n+ collar to cap the HSS-1/2 but leave the n+ collar existing to be the drain-1 and the drain-2 of the access transistors AQ1, AQ2, respectively. Such conductive plug (including n+ polysilicon plug and the n+ collar) is a vertical interconnection line connected to the underground interconnection line which extends horizontally.

Figure 16:
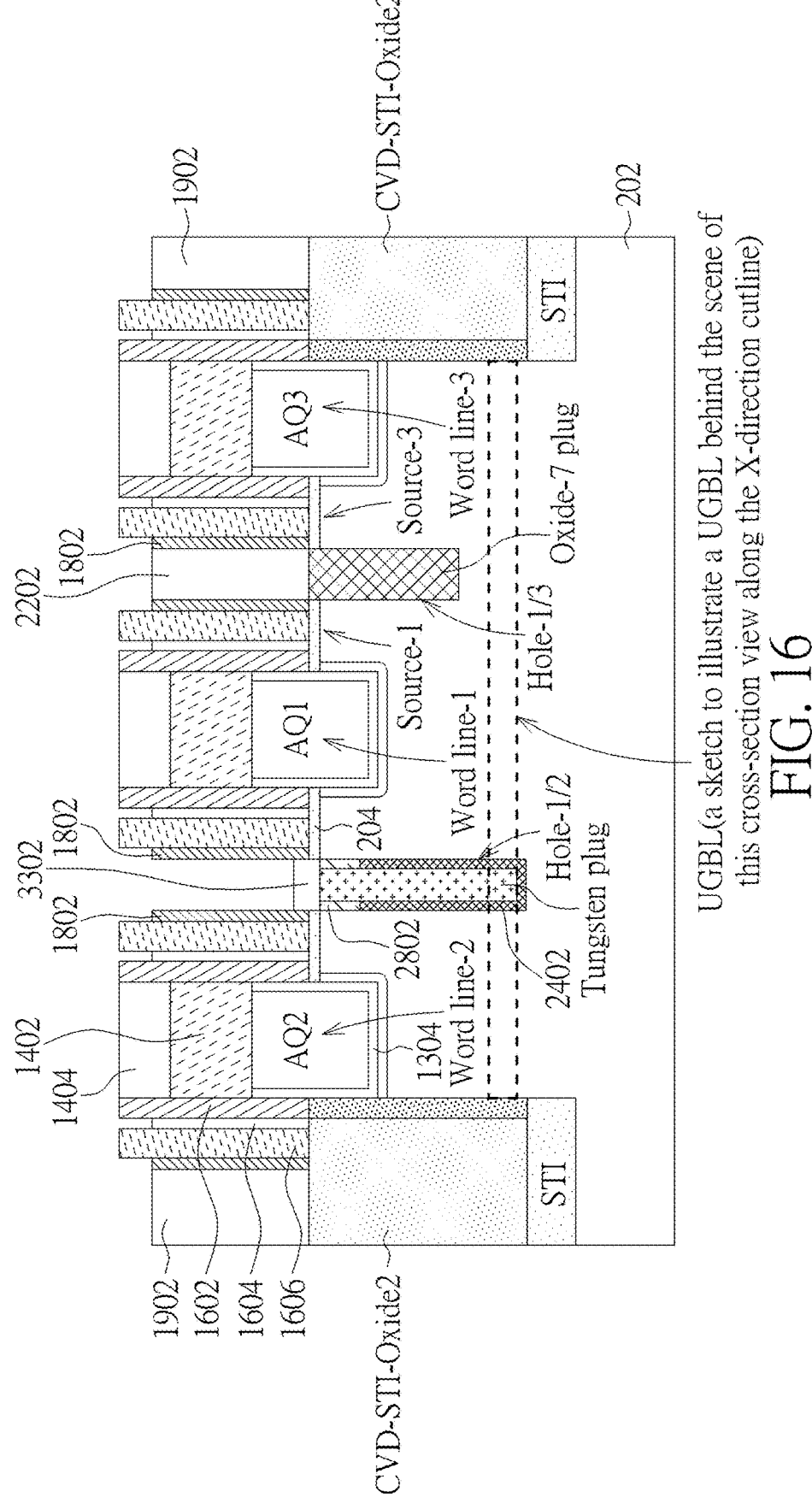
FIG. 16 is a diagram illustrating implementing the vertical connection (bridge) and the drain of the access transistor and how they are connected to the underground interconnection according to another embodiment.

FIG. 16 discloses another embodiment to implement the vertical connection (bridge) and the drain of the access transistor and how they are connected to the underground interconnection. By following the processes described above to thermally grow the oxide-8 layer 2402 and to remove the nitride-1 spacer within the hole-1/2, instead of depositing the n+ doped polysilicon film 2802 which is etched back to leave an n+ polysilicon plug inside the hole-1/2, a thick layer of Tungsten or other metal material is created (by deposit or any other way) to fill the hole-1/2 and then which is etched back to leave a Tungsten plug (called W-2 plug) inside the hole-1/2. The W-2 plug is connected with underground interconnection through its opening at the sidewall of hole-1/2 which was covered by the nitride-1 spacer. The height of the W-2 plug is lower than the HSS by a well-designed distance from HSS (e.g. about 20 nm). Use an anisotropic etching technique to remove the exposed portion of the oxide-8 layer 2402 within the hole-1/2 but uncovered by the W-2 plug. Then deposit an n+ polysilicon layer to fill in the hole-1/2 and then which is etched back to be leveled off to the HSS, thus resulting in a neck-type surrounding conductive n+ polysilicon (named as n+ collar) connecting to the HSS on two sides of hole-1/2 as the drain regions of the access transistors AQ1 and AQ2, respectively, and also as a conductive bridge between the underground interconnection and the access transistor. Then, the oxide-9 layer 3302 is thermally grown locally over the Tungsten plug to cap the HSS-1/2 area but leave the n+ collar existing to be the drain regions of the access transistors AQ1 and AQ2.

Figure 17:
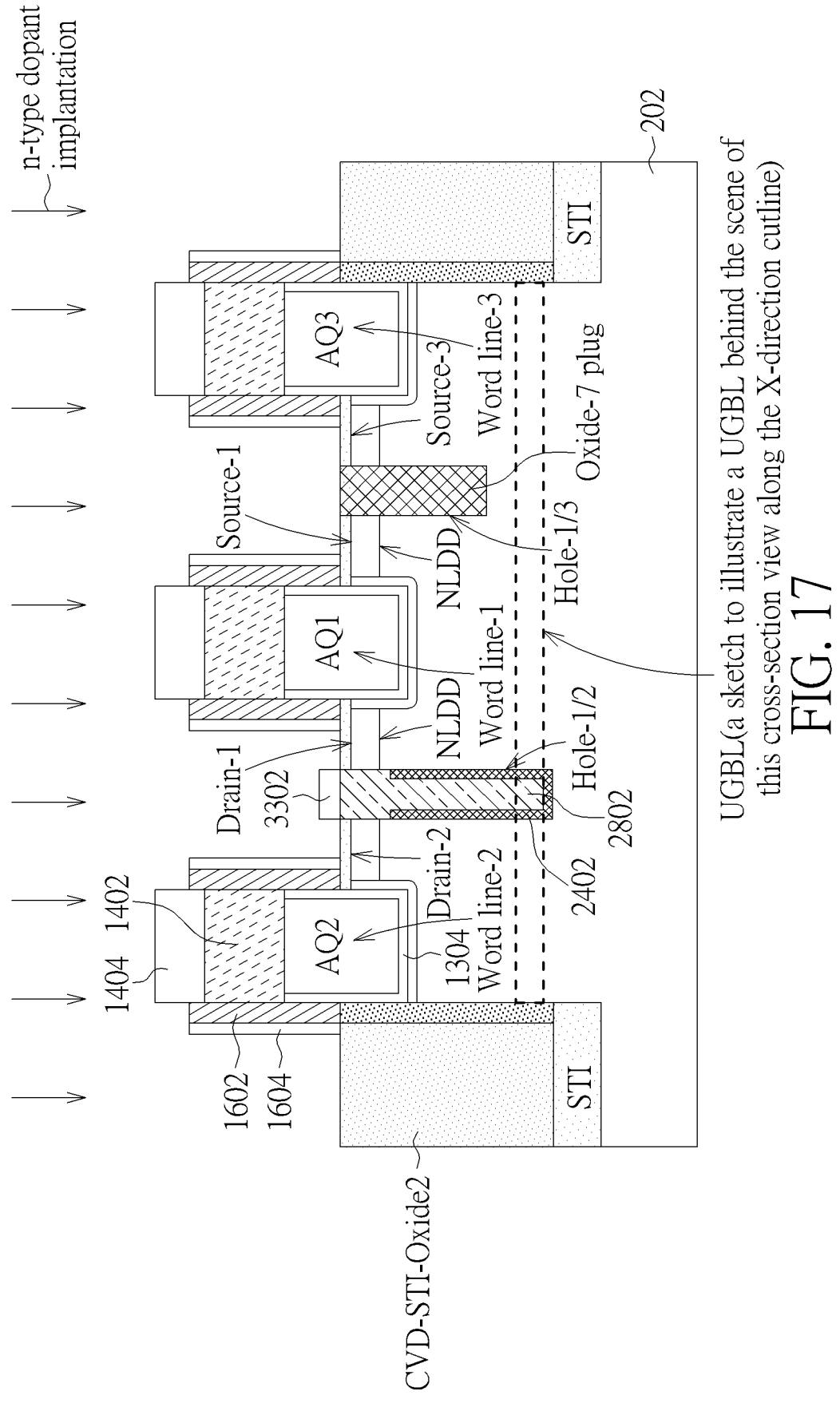
FIG. 17 is a diagram illustrating forming the drain/source region of the access transistor.

The following shows one embodiment of the present invention to form the drain/source region of the access transistor. In Step 45, as shown in FIG. 17, remove the oxide-6 layer 1802 and the nitride-5 layer 1606. Then, form n-type doped drain and source regions, respectively, into the p-type substrate 202 (e.g. an n-type dopant implantation through the pad-oxide layer 204 can be used to create both the drain and source regions (i.e., the drain-1 and the source-1 of the access transistor AQ1, the drain-2 of the access transistor AQ2, and the source-3 of the access transistor AQ3) with n-p junctions to the p-type substrate 202. In addition, a rapid thermal annealing (RTA) process may be needed to activate the n-type dopants and to eliminate any defects due to ion implantation). Of course, other method to form the drain and source regions, such as selective growth/ selective epitaxy growth, could be utilized herein. In addition, n-type lightly doped drains (NLDD) can be formed under the oxide-5 spacer and the nitride-4 spacer. Thereafter, a conventional stacked capacitor or other type capacitor (not shown) could be formed to connect the source-1 of the access transistor AQ1 to complete the DRAM cell.

Figure 18:
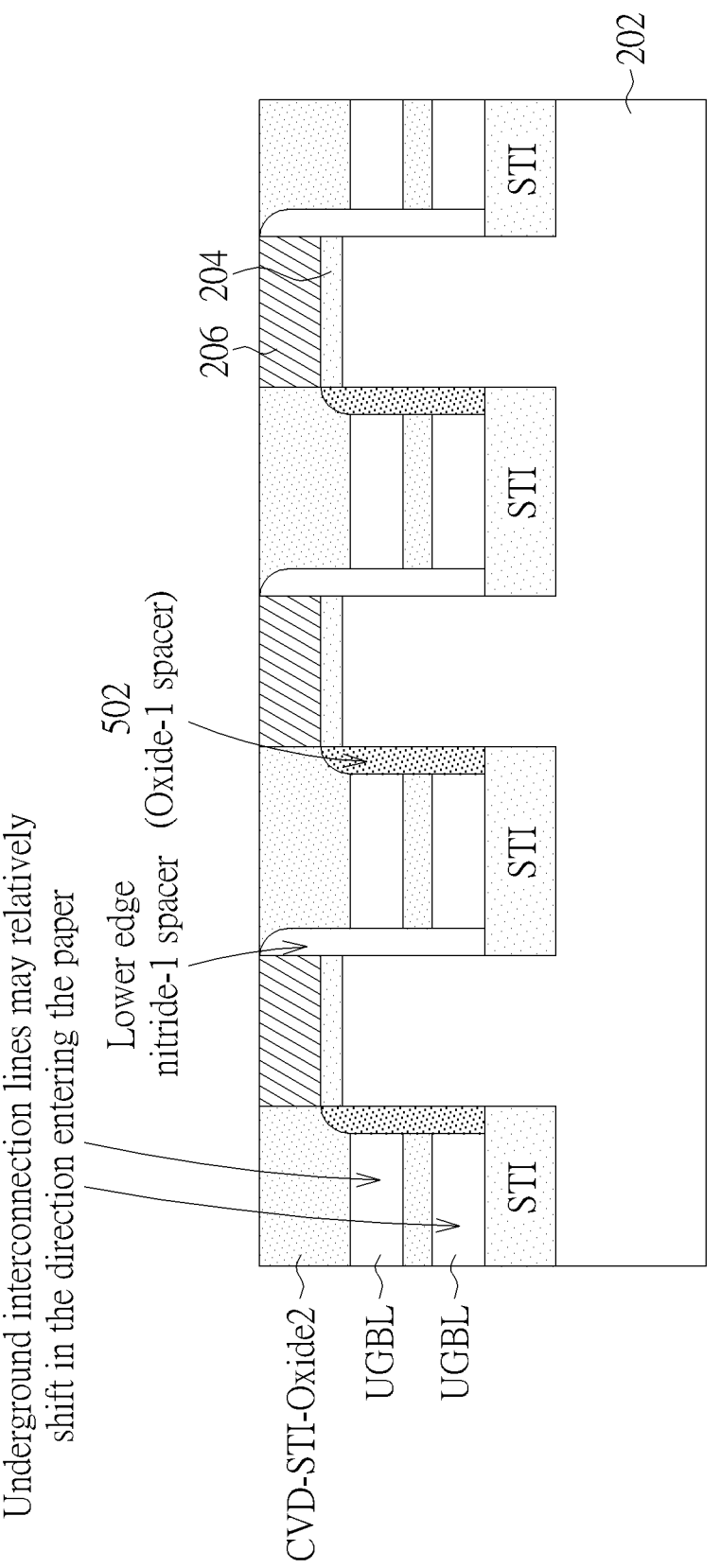
FIG. 18 is a diagram illustrating forming two different underground interconnection lines in the canal at two different vertical levels and being separated from each other by isolating material.

Thus, according to the aforesaid, an underground bit line (or underground interconnection line) is formed and connected to the drain region of the access transistor (e.g. the access transistor AQ1). Additionally, some drain or source regions of different access transistors (e.g. the access transistors AQ3, AQ2) could be connected to the underground interconnection line which provide backside power Vdd or Vss. Moreover, in another embodiment of the present invention, from processes shown above, two or more different underground interconnection lines could also be formed in the canal at two or more different vertical levels and separate from each other by isolating material (as shown in FIG. 18). Those different underground interconnection lines may have different lengths and could be connected to different transistors. Moreover, in another embodiment of the present invention, different underground interconnection lines in the canal may have relative shift in the direction entering the paper of FIG. 18. Furthermore, different underground interconnection lines could be made by different material, and could have different thickness.

The underground interconnection line could have similar resistance of the metal 0 utilized in foundry processes. Thus, as previously mentioned, the underground interconnection line could be as bit lines in DRAM memory array circuit to release/free the layout space and to shrink the size of DRAM memory array circuit. Please refer to FIG. 19 which illustrates the conventional DRAM structure, data XIO (for example, signal ONE or signal High) will be transferred along a data input circuit DI, a global I/O path GIO, a data line sense amplifier 70, and a data line DL. Furthermore, the data XIO will be transferred between the data line DL and a memory array 75 in which the data XIO is stored in a corresponding storage node through a bit line BL. In the memory array 75, as shown in FIG. 20, a sense amplifier 80 is connected to the bit line BL which is coupled to the data line DL through the bit line switch BL100. A plurality DRAM cells (such as 512 cells) are connected to one bit line BL. The bit line has a first terminal end (E1) connected to the first DRAM cell of the plurality DRAM cells and a second terminal end (E2) connected to the last DRAM cell of the plurality DRAM cells. In FIG. 21, using one DRAM cell which includes an access transistor 11 and a storage capacitor 12 as an example, a gate of an access transistor 11 is coupled to a word-line (WL) and the sense amplifier 80 is coupled to the access transistor 11 through the bit-line (BL). The sense amplifier 80 includes two PMOS transistors (P1 and P2 in FIG. 21) and two NMOS transistors (N3 and N4 in FIG. 21). Moreover, the sense amplifier 80 is connected to a VSSSA power source through the transistor SLP which is connected to the P1 and P2 transistors through the connection line LSLP. The sense amplifier 80 is also connected to a VSS source through the transistor SLN which is connected to the N1 and N2 transistors through the connection line LSLN. The DRAM cell uses the access transistor 11 as a switch to control the charges to be stored from the bit line (BL) into the capacitor in WRITE mode or to be transferred out to bit-line in READ mode. In addition, as shown in FIG. 19, VCCSA is a supply voltage.

Figure 19:
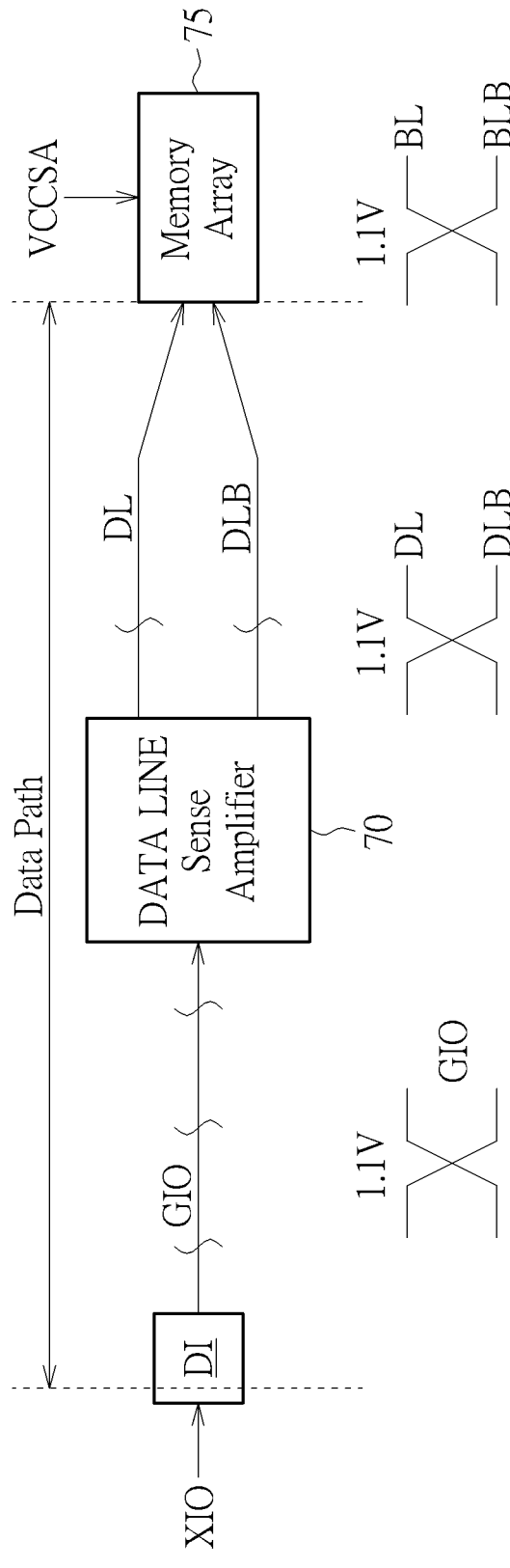
FIG. 19 is a diagram illustrating a voltage swing on the data path during a write operation for a conventional lower power DRAM.
Figure 20:
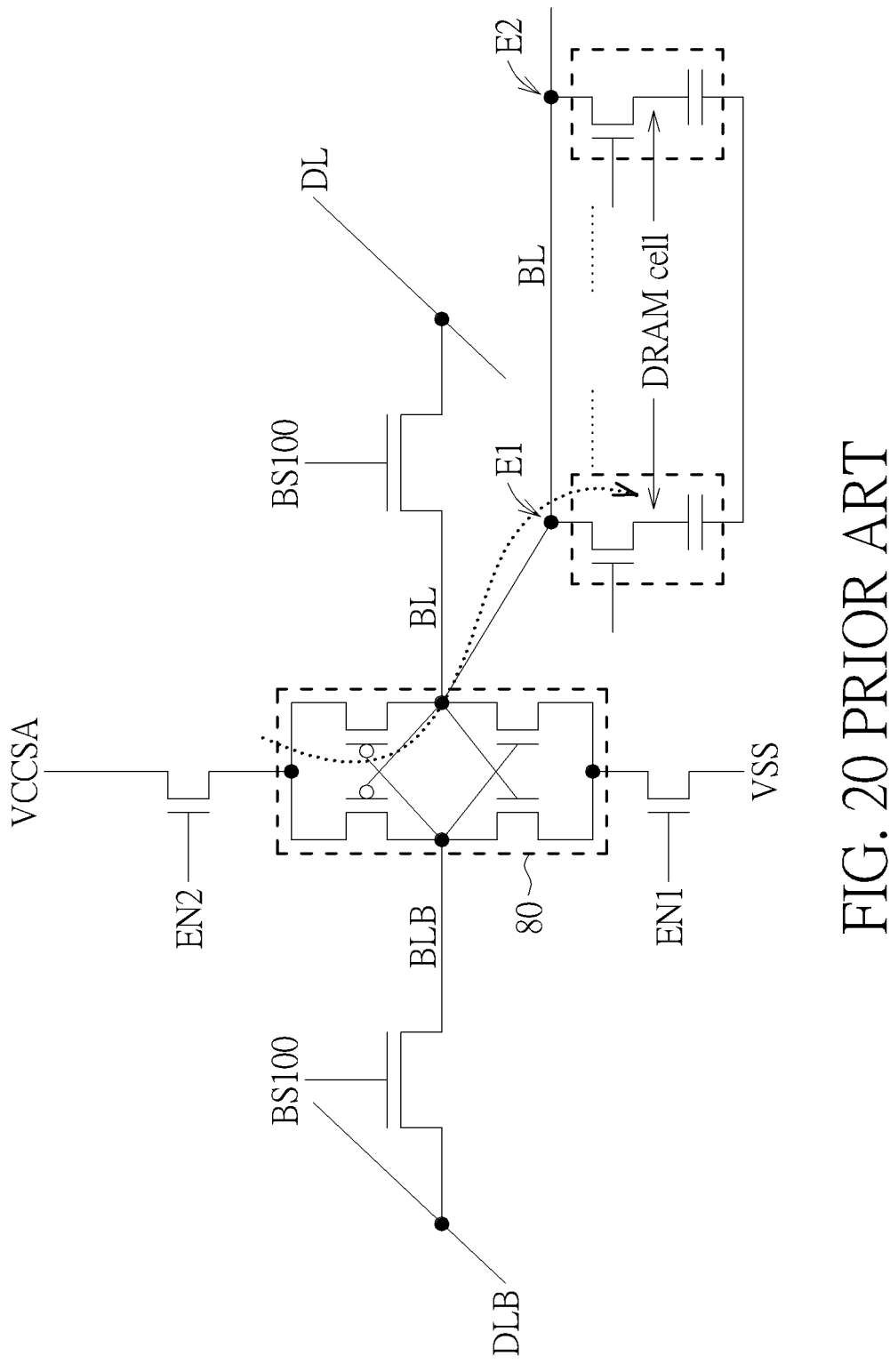
FIG. 20 is a diagram illustrating a schematic circuit for the sense amplifier selectively coupled to two separate voltage sources during WRITE operation of the DRAM cell.
Figure 21:
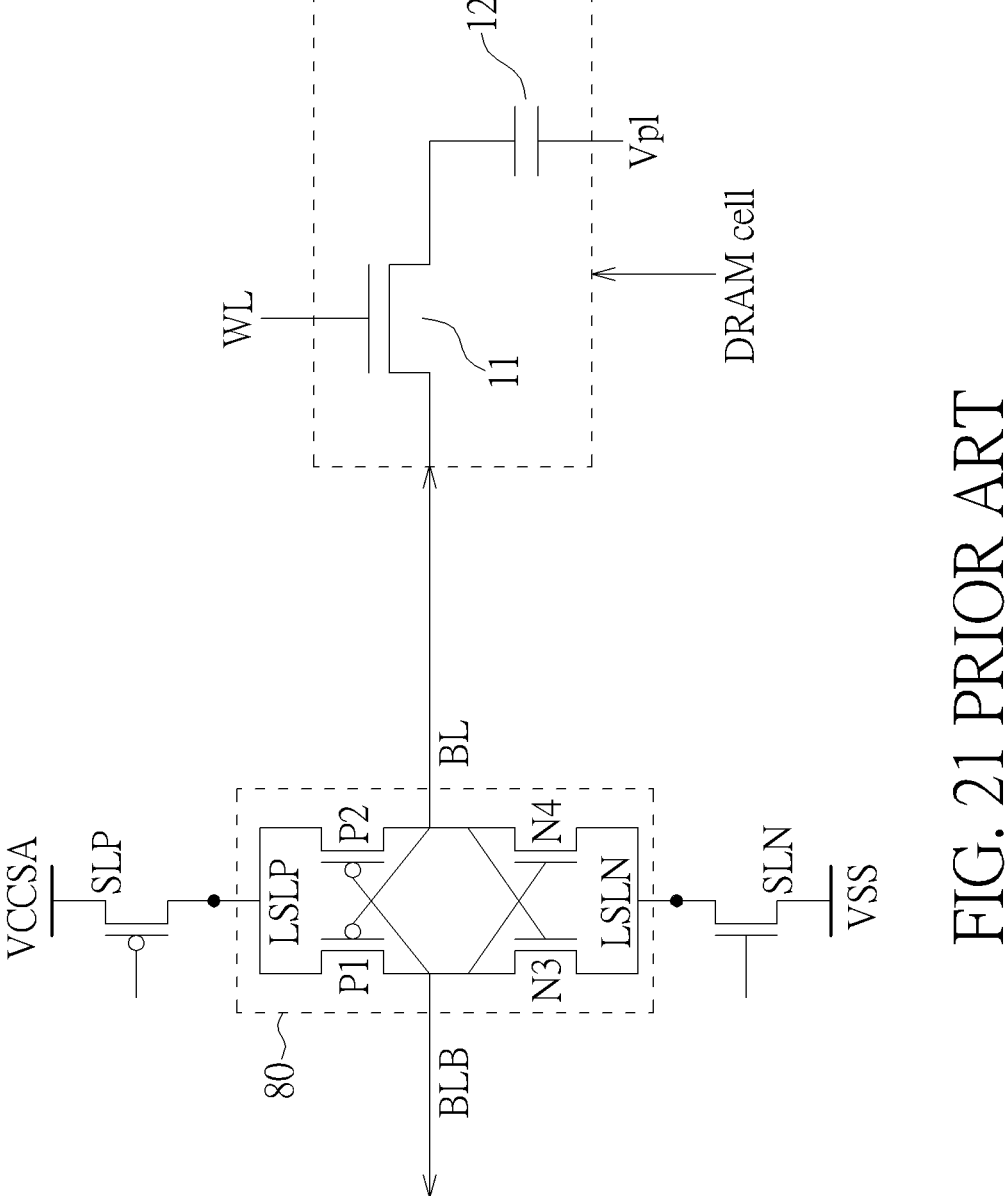
FIG. 21 is a diagram illustrating commonly used design of the DRAM cell.
Figure 22:
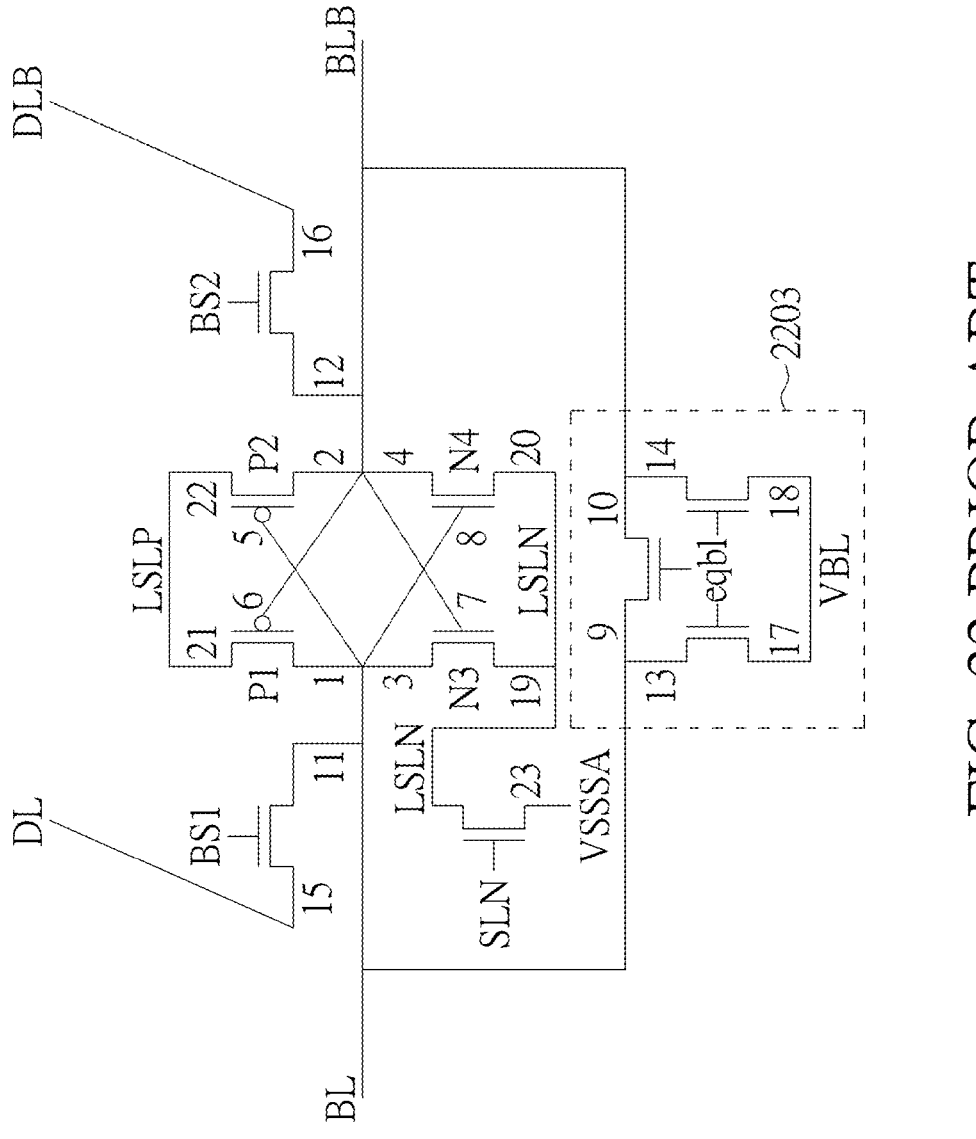
FIG. 22 is a diagram illustrating the schematic figure for a conventional sense amplifier and equalization circuit design.

Thus, a DRAM cell array design is shown in FIG. 19, FIG. 20, FIG. 21 includes (1) a DRAM array with many DRAM cells, such as the most popular 1T1C cell including one access transistor (threshold voltage Vth, usually around 0.7V nominal) and one storage capacitor (usually 17fF typical in 20~28 nm process node, and could be lower than 10fF in the event the process node is lower than 20 nm); (2) these many 1T1C cells have their drain regions of the 1T access transistors to be connected respectively to an interconnection which is named as bit line; (3) the gates of these 1T access transistors are also connected respectively by an interconnection which is named as Word line. The bit line is connected to a sense amplifier, for example, which is a CMOS cross-couple circuits (i.e. the sense amplifier 80). Correspondingly there is another bit line, named as bit line-Bar which carries a complementary signal to that of bit line and is also connected to the same sense amplifier. Along such bit line (BL) and bit line-Bar (BLB) interconnections there are other devices to be connected for performing complete bit line functions in operations, such as equalization circuit 2203 (as shown in FIG. 22) for equalizing the voltage potentials as needed and bit-switches (BS1 and BS2 shown in FIG. 22) for controlling signals in between bit lines (BL and BLB shown in FIG. 22) to the data lines (DL and DLB shown in FIG. 22). In addition, as shown in FIG. 22, SLN and eqp1 are control signals for the sense amplifier and the equalization circuit 2203, respectively. In addition, as shown in FIG. 20, VCCSA and VSS are supply voltages, and EN1 and EN2 are control signals for the sense amplifier 80. In addition, as shown in FIG. 22, VSSSA and VBL are voltages.

FIG. 22 is a schematic figure for a conventional sense amplifier design. There are connection lines 1~23 in the sense amplifier for circuit connection. The bit-switches BS1 and BS2 are connected to BL and BLB through connection lines 11 and 12, respectively. The PMOS transistor P1 is connected to BL and BLB through connection lines 1 and 6, respectively. The PMOS transistor P2 is connected to BL and BLB through connection lines 5 and 2, respectively. The NMOS transistor N3 is connected to BL and BLB through connection lines 3 and 7, respectively. The NMOS transistor N4 is connected to BL and BLB through connection lines 8 and 4, respectively. The three transistors in the equalization circuit 2203 are connected to the BL and BLB through connection lines 9, 10, 13, and 14.

Figure 23:
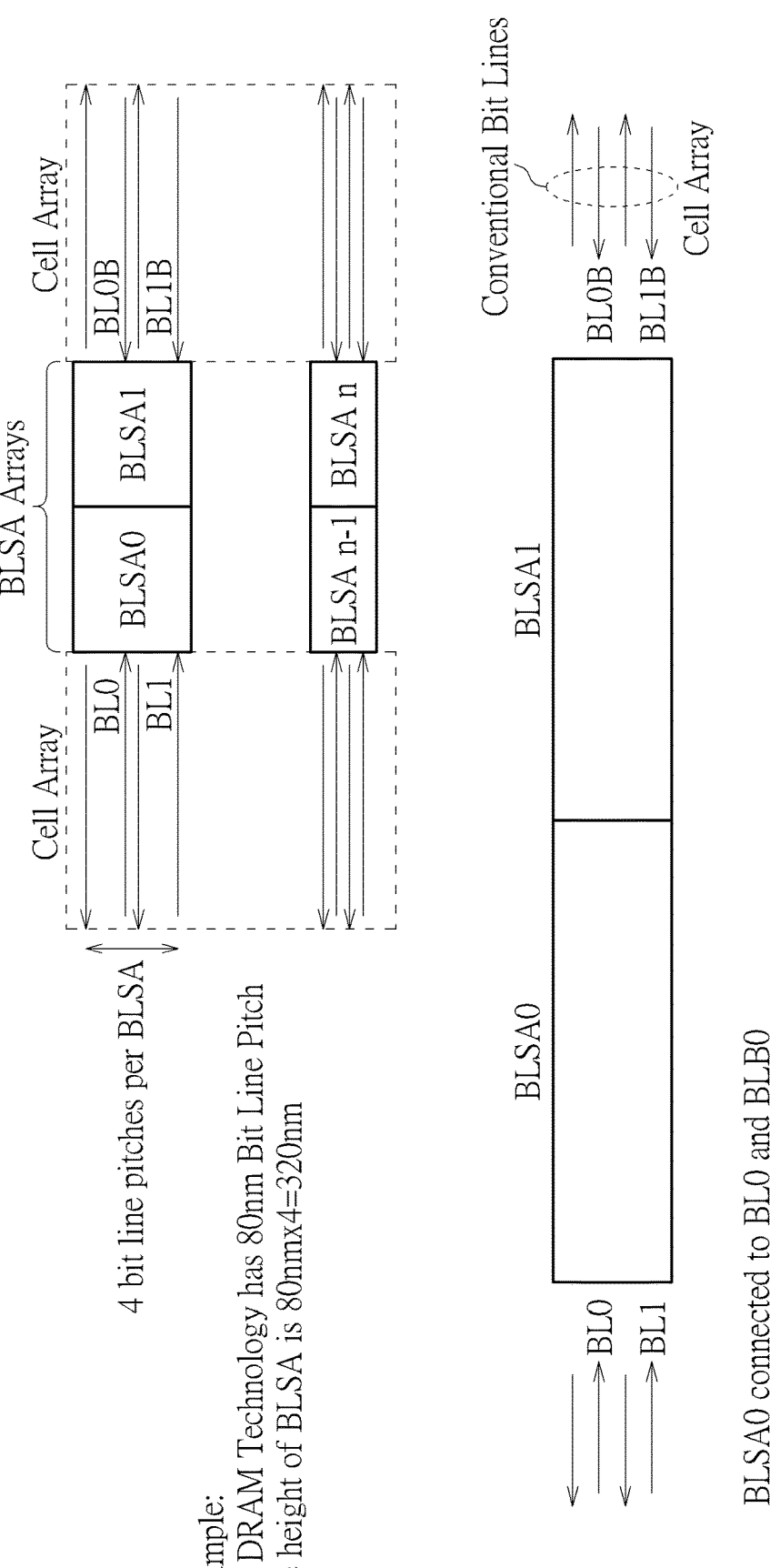
FIG. 23 and FIG. 24 are diagrams illustrating the conventional DRAM open-bit line's bit Line sense amplifier (BLSA) design.
Figure 24:
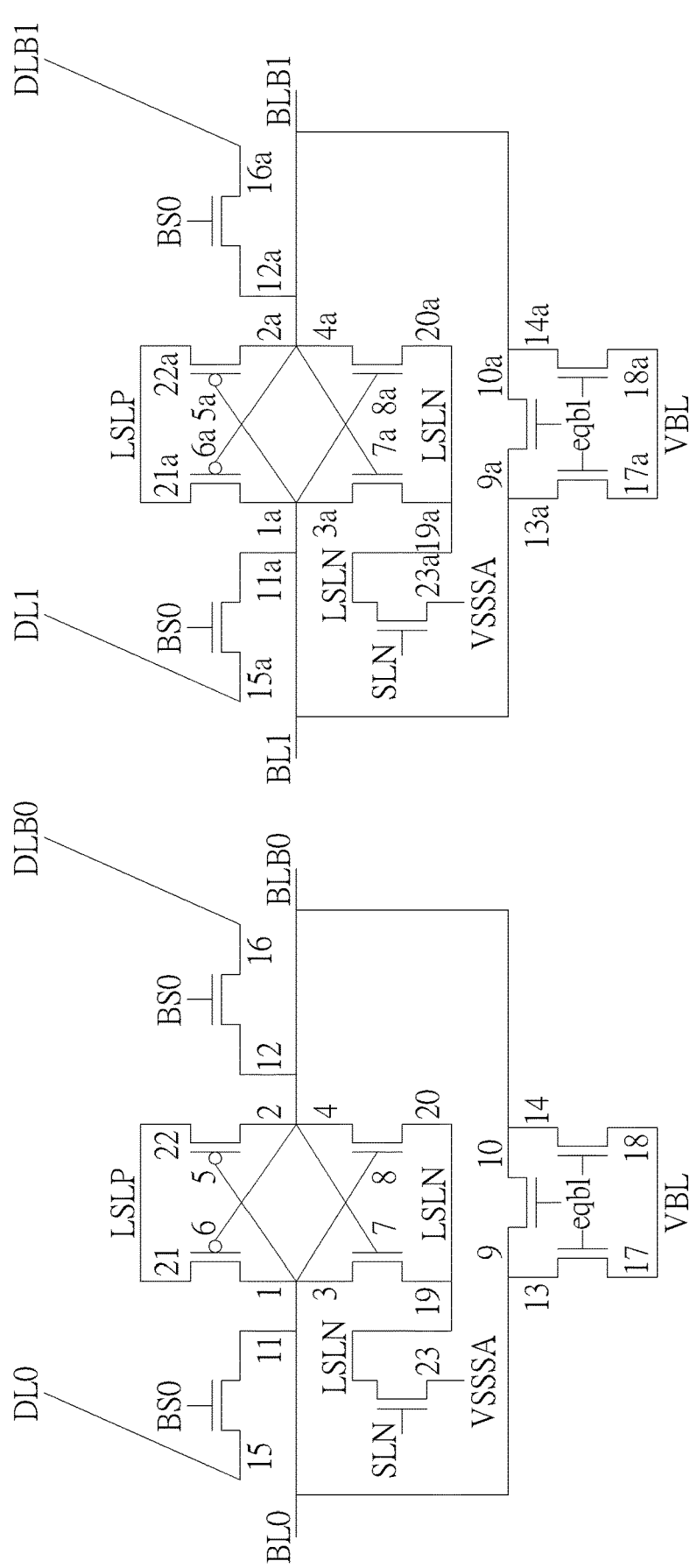

On the other hand, as shown in FIG. 23, FIG. 24, in conventional DRAM open-bit line's bit Line sense amplifier (BLSA) design, two BLSAs (e.g. BLSA0 and BLSA1 in FIG. 23, FIG. 24) are placed side by side to each other. The connection lines 1~23 in BLSA0 and the connection lines 1a~23a in BLSA1 usually are made of metal 0 layer or other metal layers during the layout process, and the BL and BLB are made of metal 0 layer as well. Thus, those connection lines made of metal 0 incur pitch limitation therebetween and cause the larger layout area.

Figure 25:
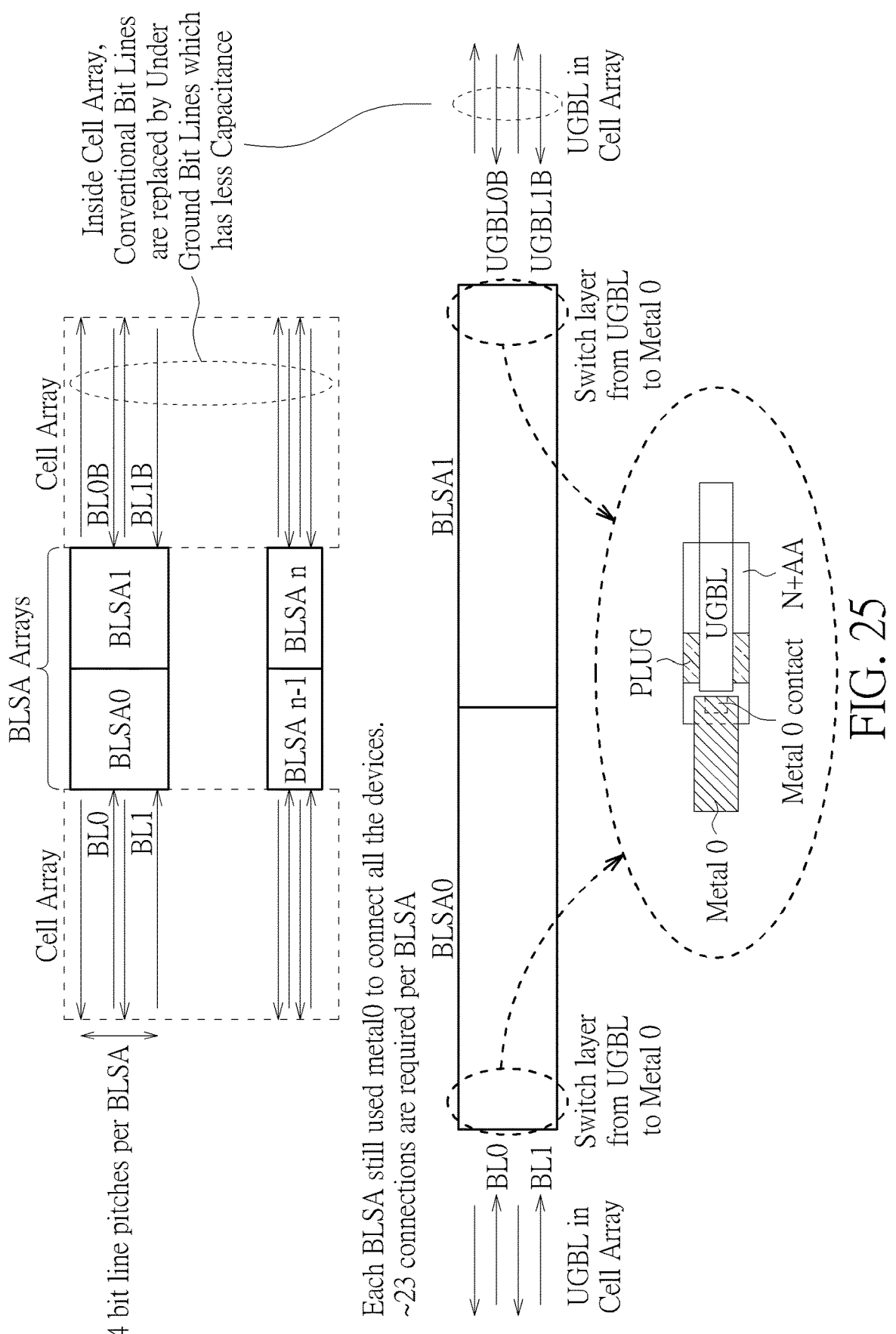
FIG. 25 is a diagram illustrating coupling relationships between the active area region, the connection plug, and the metal 0 layer.

However, the present invention proposes the above-mentioned UGBL technology for bit lines (BL and BLB) and then connected the underground bit lines to the aforesaid BLSA, as shown in FIG. 25. The connection lines 1~23 in BLSA0 in FIG. 24 and the connection lines 1a~23a in BLSA1 in FIG. 24 are still made of metal 0 layer or other metal layers as in the conventional DRAM, but the bit lines (BL and BLB) now are positioned underground. Therefore, it is possible to connect those connection lines made of metal 0 layer in BLSA to the underground bit lines (BL and BLB) through a switch layer. As mentioned in FIG. 25, the underground interconnection line is connected to the access transistor in the active area ("AA") region through the connection plug therein. The AA region (or active region) in one example is a silicon region surrounded by isolation regions. Thus, the bit lines (BL and BLB) which are underground could be first connected to the AA region during the layout process, then the AA region is connected to the metal 0 layer through the metal 0 contact during the layout process, as shows in the bottom of FIG. 25. Moreover, two bit lines (such as the bit lines) could be within one isolation region and/or located at two different levels respectively therein, as shown in FIG. 18. Therefore, the pitch limitation in conventional bit Line sense amplifier (shown in FIG. 23 and FIG. 24) could be released.

In this embodiment, the switch layer may include the metal 0 contacts, the AA region connected to metal 0 contacts, and PLUG (that is, the vertical connection line) which connects the AA to underground bit lines (BL and BLB). Though the PLUG, AA region and the metal 0 contact, those connection lines made of metal 0 layer in BLSA could be electrically connected to the underground bit lines (BL and BLB). The AA region in the switch layer could be a dummy AA region without any transistor therein. As previously mentioned, the PLUG in the AA region is connected to the sidewall of the underground bit line. To reduce the resistance of the switch layer, it is possible to have two or more PLUGs in the AA region connected to the same underground bit line (BL or BLB), as shown in the enlarged portion of FIG. 25.

To sum up, the memory array circuit provides an underground interconnection or underground interconnection line embedded into the silicon substrate with both high conductivity and effectively optimized isolations from the silicon substrate. The underground interconnection can be connected vertically (bridged) to either source or drain region of any transistor by a compact self-alignment invention. Many device and circuit design innovations can thus be created. Further, because the memory array circuit can even introduce different layers or various levels of supply voltages vertically distributed in the substrate of the die but embedded with necessary isolations underneath the horizontal silicon surface (HSS), the memory array circuit can enhance both transistor and circuit performances (speed, power and noise, etc.) accordingly and reduce more complexities above the HSS.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A memory array circuit, comprising:
a semiconductor substrate with an original surface;
a memory array;

a bit line and a complementary bit line connected to the memory array; and
a bit line sense amplifier circuit electrically connected to the bit line and the complementary bit line, comprising:
  a first plurality of transistors, each transistor comprising a gate node, a first conductive node, and a second conductive node;
  a plurality of switch layers; and
  a first set of connection lines electrically connecting the first plurality of transistors to the bit line and the complementary bit line, wherein the plurality of switch layers electrically connect the first set of connection lines to the bit line and the complementary bit line;
wherein the first set of connection lines is above the original surface of the semiconductor substrate, the bit line and the complementary bit line are under the original surface of the semiconductor substrate and extend from the memory array to the bit line sense amplifier circuit.

2. The memory array circuit of claim 1, wherein the bit line and the complementary bit line are isolated from the semiconductor substrate.

3. The memory array circuit of claim 1, wherein the first set of connection lines connecting the first plurality of transistors to the bit line and the complementary bit line are made of a set of metal layers.

4. The memory array circuit of claim 3, wherein the first set of connection lines connects the first plurality of transistors to the bit line and the complementary bit line through a set of metal contacts connecting to the set of metal layers, a set of active regions connecting to the set of metal contacts, and a set of plugs connecting the set of active regions to the bit line and the complementary bit line.

5. The memory array circuit of claim 4, wherein one plug is within one active region, and the one plug is connected to a sidewall of the bit line.

6. The memory array circuit of claim 4, wherein the bit line is surrounded by one active region, and at least two plugs are within the one active region and connected to a first and a second sidewalls of the bit line, respectively.

7. The memory array circuit of claim 6, wherein the one active region is a dummy active region without any transistor therein.

8. The memory array circuit of claim 1, wherein the first set of connection lines connects gate nodes of the first plurality of transistors to the bit line and the complementary bit line.

9. The memory array circuit of claim 1, wherein the first set of connection lines connects first conductive nodes of the first plurality of transistors to the bit line and the complementary bit line.

10. The memory array circuit of claim 1, wherein the bit line and the complementary bit line are located at two different levels respectively therein.

11. A memory array circuit, comprising:
a semiconductor substrate with an original surface;
an access transistor formed within a first active region of the semiconductor substrate;
a capacitor connected to a source region of the access transistor;
a memory array;
a bit line electrically connected to a drain region of the access transistor through a first plug under the original surface and further connected to the memory array; and
a bit line sense amplifier circuit connected to the bit line, comprising:

a first plurality of transistors, each transistor comprising a gate node, a first conductive node, and a second conductive node;

a plurality of switch layers; and a first set of connection lines electrically connecting the first plurality of transistors to the bit line, wherein the plurality of switch layers electrically connect the first set of connection lines to the bit line and the complementary bit line;

wherein the first set of connection lines is above the original surface of the semiconductor substrate, and the bit line is under the original surface of the semiconductor substrate and extends from the memory array to the bit line sense amplifier circuit.

12. The memory array circuit of claim 11, wherein the bit line is within an isolation region next to the first active region.

13. The memory array circuit of claim 11, wherein the first plug is within the first active region, and the first plug is connected to a sidewall of a first portion of the bit line.

14. The memory array circuit of claim 13, wherein each switch layer includes a second active region, a second plug in the second active region and connecting to a sidewall of a second portion of the bit line, and an electrical contact connecting the second active region to the first set of connection lines.

15. The memory array circuit of claim 14, wherein the second portion of the bit line is surrounded by the second active region.

\* \* \* \* \*